US012586612B2

(12) United States Patent
Kajiyama et al.

(10) Patent No.: US 12,586,612 B2
(45) Date of Patent: Mar. 24, 2026

(54) SEMICONDUCTOR MEMORY DEVICE

(71) Applicant: Kioxia Corporation, Tokyo (JP)

(72) Inventors: Yasufumi Kajiyama, Kamakura (JP); Masaru Koyanagi, Ota (JP)

(73) Assignee: Kioxia Corporation, Tokyo (JP)

( * ) Notice: Subject to any disclaimer, the term of this patent is extended or adjusted under 35 U.S.C. 154(b) by 171 days.

(21) Appl. No.: 18/531,907

(22) Filed: Dec. 7, 2023

(65) Prior Publication Data

US 2024/0242744 A1 Jul. 18, 2024

(30) Foreign Application Priority Data

Dec. 8, 2022 (JP) ................................. 2022-196543

(51) Int. Cl.
G11C 7/04 (2006.01)
G11C 7/10 (2006.01)

(52) U.S. Cl.
CPC .............. G11C 7/04 (2013.01); G11C 7/1033 (2013.01); G11C 7/109 (2013.01)

(58) Field of Classification Search
CPC ......... G11C 7/04; G11C 7/1033; G11C 7/109; G11C 11/4093; G11C 7/1087; G11C 7/1093; G11C 7/1078

USPC .......................................................... 365/211
See application file for complete search history.

(56) References Cited

U.S. PATENT DOCUMENTS

| | | | |
|---|---|---|---|
| 10,747,245 B1* | 8/2020 | He .......................... | G11C 5/063 |
| 2012/0250423 A1 | 10/2012 | Koyanagi et al. | |
| 2020/0202957 A1 | 6/2020 | Terada et al. | |
| 2022/0059165 A1* | 2/2022 | Satou ................. | H03K 19/0005 |
| 2022/0065702 A1* | 3/2022 | Terada ................... | G11C 16/26 |
| 2022/0343996 A1* | 10/2022 | Lee ....................... | G11C 7/1063 |

FOREIGN PATENT DOCUMENTS

| | | |
|---|---|---|
| JP | 2012-216265 A | 11/2012 |
| JP | 2013-69759 A | 4/2013 |
| JP | 2020-102283 A | 7/2020 |

* cited by examiner

*Primary Examiner* — Amir Zarabian
*Assistant Examiner* — Minh Dinh
(74) *Attorney, Agent, or Firm* — Oblon, McClelland, Maier & Neustadt, L.L.P.

(57) ABSTRACT

A semiconductor memory device according to the present disclosure includes a memory cell array (110, 210), an input/output circuit (23) that inputs/outputs a signal from/to the memory cell array, and a temperature acquiring circuit (29) that generates temperature information according to the temperature of the memory cell array, and corrects the characteristics of the input/output circuit based on the temperature information.

10 Claims, 19 Drawing Sheets

FIG.12

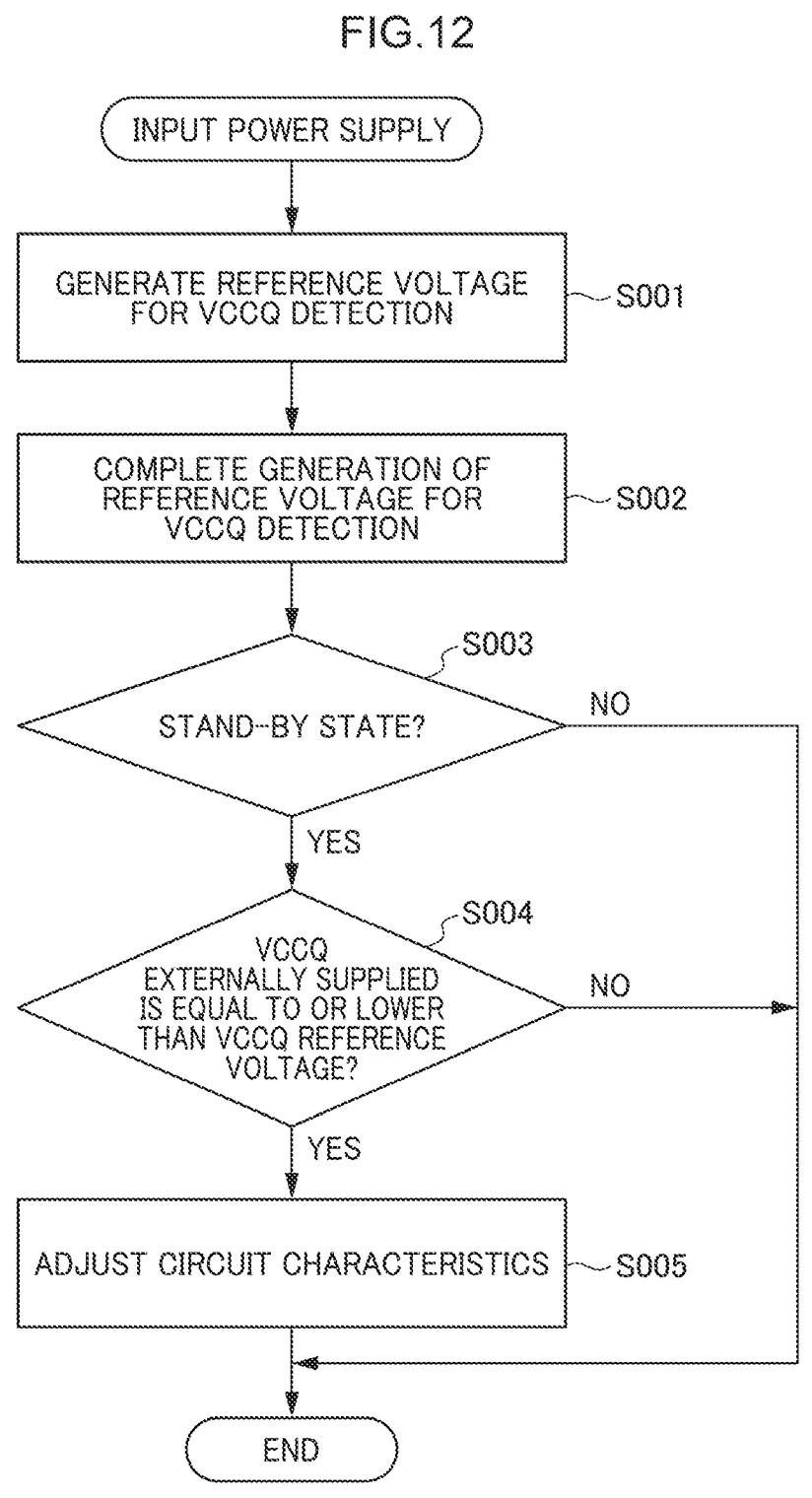

INPUT POWER SUPPLY

GENERATE REFERENCE VOLTAGE FOR VCCQ DETECTION  ~S001

COMPLETE GENERATION OF REFERENCE VOLTAGE FOR VCCQ DETECTION  ~S002

S003

STAND-BY STATE?  ──NO

YES

S004

VCCQ EXTERNALLY SUPPLIED IS EQUAL TO OR LOWER THAN VCCQ REFERENCE VOLTAGE?  ──NO

YES

ADJUST CIRCUIT CHARACTERISTICS  ~S005

END

FIG.14

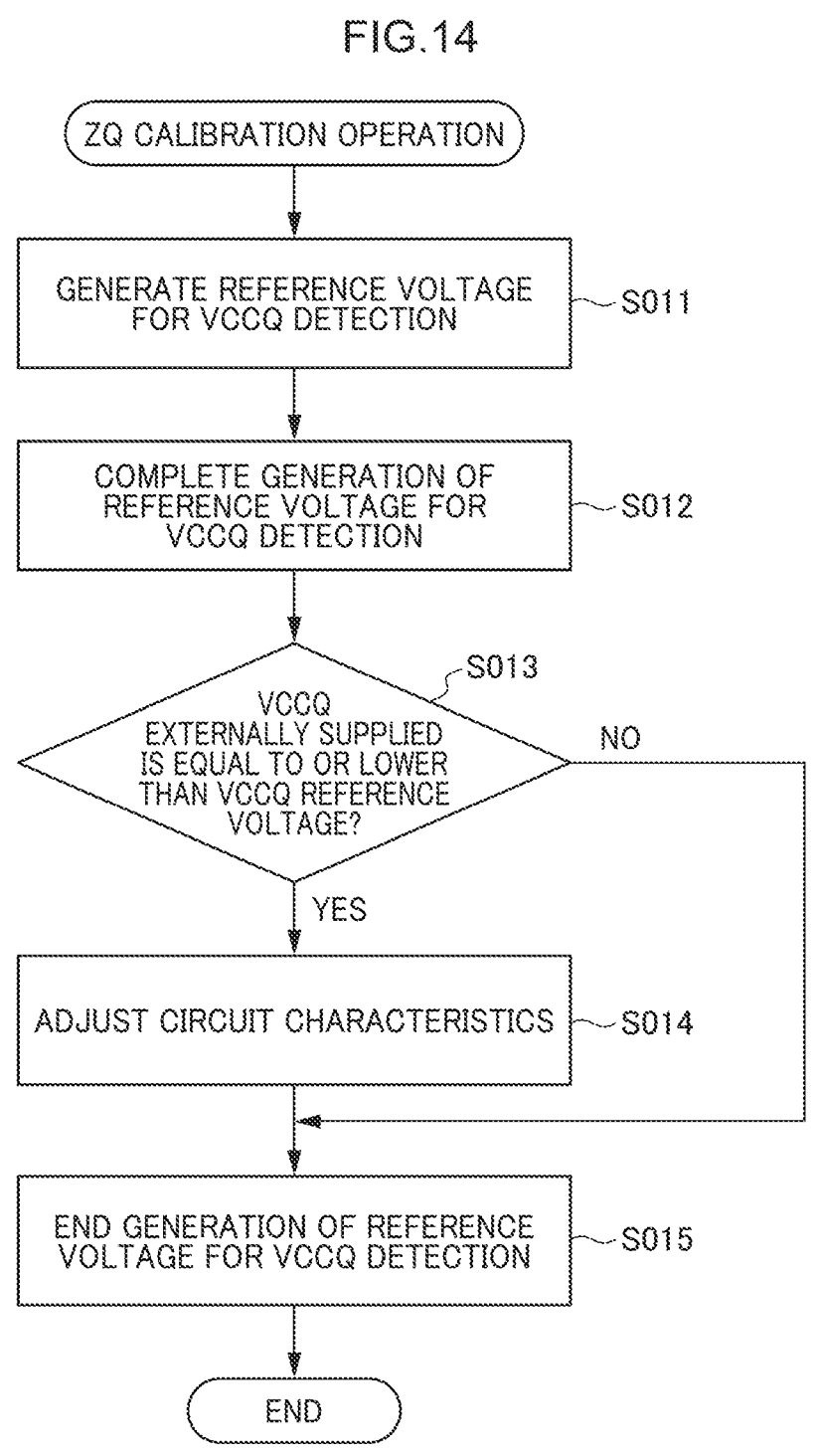

ZQ CALIBRATION OPERATION

GENERATE REFERENCE VOLTAGE
FOR VCCQ DETECTION — S011

COMPLETE GENERATION OF
REFERENCE VOLTAGE FOR
VCCQ DETECTION — S012

S013

VCCQ
EXTERNALLY SUPPLIED
IS EQUAL TO OR LOWER
THAN VCCQ REFERENCE
VOLTAGE?

NO

YES

ADJUST CIRCUIT CHARACTERISTICS — S014

END GENERATION OF REFERENCE
VOLTAGE FOR VCCQ DETECTION — S015

END

FIG.16

SEMICONDUCTOR MEMORY DEVICE

CROSS-REFERENCE TO RELATED APPLICATION

The present application is based upon and claims the benefit of priority from Japanese Patent Application No. 2022-196543 filed with the Japan Patent Office on Dec. 8, 2022, the entire content of which is hereby incorporated by reference.

TECHNICAL FIELD

The present disclosure relates to a semiconductor memory device.

DESCRIPTION OF THE RELATED ART

A semiconductor memory device has been known.

BRIEF DESCRIPTION OF THE DRAWINGS

FIG. 12 is a flowchart of a case in which constant VCCQ detection is performed;

FIG. 14 is a flowchart of a case in which a ZQ calibration operation and VCCQ detection are performed in parallel;

FIG. 16 is a circuit diagram for explaining VCCQ detection;

DETAILED DESCRIPTION

Figure 1:
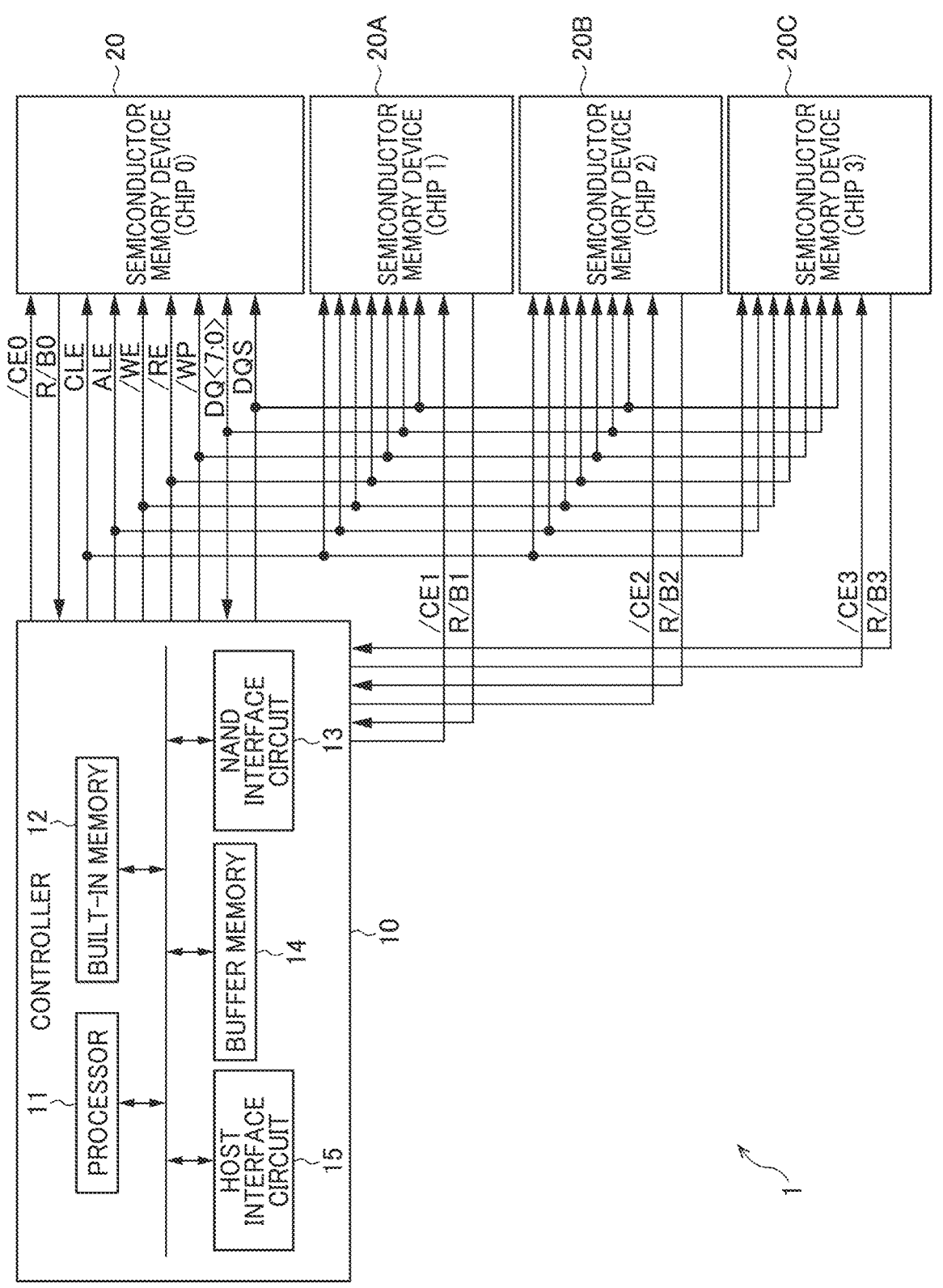
FIG. 1 is a block diagram for explaining the configuration of a memory system according to an embodiment.

Hereinafter, the present embodiment will be described with reference to the attached drawings. For easier understanding of the description, the same constituent elements in the drawings are assigned common reference signs as much as possible, and the overlapping descriptions will be omitted.

Note that in the following description, signals X<m: 0>(m is a natural number) are (m+1)-bit signals, and mean a set of signals X<0>, X<1>, . . . , and X<m>, each signal being 1-bit signal. Constituent elements Y<m:0> mean a set of constituent elements Y<0>, Y<1>, . . . , and Y<m>, which correspond, one-to-one, to inputs or outputs of the signals X<m: 0>.

A semiconductor memory device according to the present embodiment will be described. The semiconductor memory device according to the present embodiment includes, for example, a NAND flash memory.

The overall configuration of a memory system according to the present embodiment will be described with reference to FIG. 1. For example, a memory system 1 communicates with an external host device (not shown). The memory system 1 retains data transmitted from the host device. The memory system 1 transmits the retained data to the host device.

As shown in FIG. 1, the memory system 1 includes a controller 10 and a plurality of semiconductor memory devices 20, 20A, 20B, and 20C. The memory system 1 is provided, for example, within one package. The controller 10 receives a command from the host device and controls the semiconductor memory devices 20, 20A, 20B, and 20C based on the received command. Specifically, the controller 10 writes data instructed to be written by the host device to the semiconductor memory devices 20, 20A, 20B, and 20C. The controller 10 reads data instructed to be read by the host device from the semiconductor memory devices 20, 20A, 20B, and 20C and transmits the data to the host device. The controller 10 is connected to the semiconductor memory devices 20, 20A, 20B, and 20C through a NAND bus.

The semiconductor memory devices 20, 20A, 20B, and 20C each include a plurality of memory cell arrays and store data in a nonvolatile manner, for example. Without being limited to this, the memory cell array may store data in a volatile manner. The semiconductor memory devices 20, 20A, 20B, and 20C are, for example, semiconductor chips that are each assigned a chip address in advance so as to be uniquely distinguishable from one another. The semiconductor memory devices 20, 20A, 20B, and 20C are independently operated by an instruction of the controller 10.

Note that in the following description, the semiconductor memory devices 20, 20A, 20B, and 20C may be referred to as chips 0, 1, 2, and 3, respectively. Further, FIG. 1 shows an example of four chips 0, 1, 2, and 3 being connected to the controller 10, but any number of chips can be connected to the controller 10, without being limited to four.

The same types of signals are transmitted and received through the NAND bus connected to each of the semiconductor memory devices 20, 20A, 20B, and 20C. The NAND bus includes a plurality of signal lines, and transmits and receives signals/CE0, /CE1, /CE2, /CE3, CLE, ALE, /WE, /RE, RE, /WP, R/B0, R/B1, R/B2, R/B3, DQ<7:0>, DQS, and/DQS. The signals/CE0, /CE1, /CE2, /CE3, CLE, ALE, /WE, /RE, RE, /WP, R/B0, R/B1, R/B2, R/B3, DQ<7:0>, DQS, and/DQS are based on a NAND interface. The signals CLE, ALE, /WE, /RE, RE, and/WP are received by the semiconductor memory devices 20, 20A, 20B, and 20C. The signals R/B0, R/B1, R/B2, and R/B3 are received by the controller 10. The signals/CE0, /CE1, /CE2, and/CE3 are received by the semiconductor memory devices 20, 20A, 20B, and 20C, respectively.

The signals/CE0, /CE1, /CE2, and/CE3 are chip enable signals. The signals/CE0, /CE1, /CE2, and/CE3, while being at an L (Low) level, respectively enable the semiconductor memory devices 20, 20A, 20B, and 20C.

The signal CLE is a command latch enable signal. With the signal CLE turning into an H (High) level, the semiconductor memory devices 20, 20A, 20B, and 20C recognize that the signal DQ<7:0> is a command.

The signal ALE is an address latch enable signal. With the signal ALE turning into an H (High) level, the semiconductor memory devices 20, 20A, 20B, and 20C recognize that the signal DQ<7:0> is an address.

The signal/WE is a write enable signal. In a single data rate mode, in accordance with the transition of the signal/WE from an L (Low) level to an H (High) level, the semiconductor memory devices 20, 20A, 20B, and 20C retrieve the signal DQ<7:0> corresponding to a command, an address, or data into the semiconductor memory devices 20, 20A, 20B, and 20C. Further, in a double data rate mode, in accordance with the transition of the signal/WE from an L (Low) level to an H (High) level, the semiconductor memory devices 20, 20A, 20B, and 20C retrieve the signal DQ<7:0> corresponding to a command or an address into the semiconductor memory devices 20, 20A, 20B, and 20C. The transition of a signal from an L (Low) level to an H (High) level is also referred to as a rising edge. The transition of a signal from an H (High) level to an L (Low) level is also referred to as a farring edge. Further, the transitions of a signal from an L (Low) level to an H (High) level and from an H (High) level to an L (Low) level are also collectively referred to as toggle.

The signal/RE is a read enable signal. In the single data rate mode, in accordance with the transition of the signal/RE from an H (High) level to an L (Low) level, the semiconductor memory devices 20, 20A, 20B, and 20C output the signal DQ<7:0> corresponding to data. Further, in the double data rate mode, in accordance with the transition of the signal/RE from an L (Low) level to an H (High) level and the transition of the signal/RE from an H (High) level to an L (Low) level, the semiconductor memory devices 20, 20A, 20B, and 20C output the signal DQ<7:0> corresponding to data. The signal RE is a complementary signal of the signal/RE.

The signal/WP is a write protect signal. With the signal/WP turning into an L (Low) level, writing data to and erasing data from the semiconductor memory devices 20, 20A, 20B, and 20C are prohibited.

The signals R/B0, R/B1, R/B2, and R/B3 are ready/busy signals. The signals R/B0, R/B1, R/B2, and R/B3 indicate whether the respective semiconductor memory devices 20, 20A, 20B, and 20C are in a ready state (a state in which an external command can be received) or in a busy state (a state in which an external command cannot be received).

The signal DQ<7:0> is, for example, an 8-bit signal. The signal DQ<7:0> is transmitted and received between the semiconductor memory devices 20, 20A, 20B, and 20C and the controller 10. The signal DQ<7:0> includes a command, an address, and data. The signal DQ<7:0> input to the semiconductor memory devices 20, 20A, 20B, and 20C is also referred to as an input signal. The signal DQ<7:0> output from the semiconductor memory devices 20, 20A, 20B, and 20C is also referred to as an output signal.

The signal DOS is a data strobe signal. The data strobe signal is also simply referred to as a strobe signal. The signal DQS is used for controlling the operation timing of the semiconductor memory devices 20, 20A, 20B, and 20C related to the signal DQ<7:0>. In the double data rate mode, in accordance with the transition of the signal DQS from an L (Low) level to an H (High) level and the transition from an H (High) level to an L (Low) level, the semiconductor memory devices 20, 20A, 20B, and 20C retrieve the signal DQ<7:0> corresponding to data. In the double data rate mode, by transitioning the signal DOS from an L (Low) level to an H (High) level or from an H (High) level to an L (Low) level in accordance with the timing of outputting the signal DQ<7:0> corresponding to data, the semiconductor memory devices 20, 20A, 20B, and 20C notify the controller 10 of the timing of retrieving data. The signal /DQS is a complementary signal of the signal DOS.

Note that in the semiconductor memory devices 20, 20A, 20B, and 20C, a common signal R/B is used in place of the independent signals R/B0, R/B1, R/B2, and R/B3 in some cases. In this case, the controller 10 causes each of the semiconductor memory devices 20, 20A, 20B, and 20C to output status data, using a status read command. The controller 10 can identify whether the semiconductor memory devices 20, 20A, 20B, and 20C are in a ready state or in a busy state, by causing the status data to be output. In the semiconductor memory devices 20, 20A, 20B, and 20C, a common signal/CE is used in place of the independent signals /CE0, /CE1, /CE2, and/CE3 in some cases. In this case, the controller 10 can designate any of the semiconductor memory devices 20, 20A, 20B, and 20C as an operation target, by providing a chip address.

Referring further to FIG. 1, the controller 10 of the memory system 1 according to the present embodiment will be described. The controller 10 includes a processor (CPU: Central Processing Unit) 11, a built-in memory (RAM: Random Access Memory) 12, a NAND interface circuit 13, a buffer memory 14, and a host interface circuit 15.

The processor 11 controls the overall operation of the controller 10. The processor 11, for example, issues a write command based on a NAND interface to the semiconductor memory devices 20, 20A, 20B, and 20C in response to a data write command received from a host device. This operation is similarly performed in the other operations such as read, erase, and calibration operations.

The built-in memory 12 is, for example, a semiconductor memory, such as a DRAM (Dynamic RAM) and is used as a work area for the processor 11. The built-in memory 12 retains firmware, various management tables, and the like for managing the semiconductor memory devices 20, 20A, 20B, and 20C.

The NAND interface circuit 13 is connected to the semiconductor memory devices 20, 30, 40, and 50 via the aforementioned NAND bus and addresses communication with the semiconductor memory devices 20, 20A, 20B, and 20C. The NAND interface circuit 13 transmits a command, an address, and write data to the semiconductor memory devices 20, 20A, 20B, and 20C, by an instruction of the processor 11. The NAND interface circuit 13 receives status data and read data from the semiconductor memory devices 20, 20A, 20B, and 20C.

The buffer memory 14 temporarily retains data and the like that the controller 10 has received from the semiconductor memory devices 20, 20A, 20B, and 20C and the host device. The buffer memory 14 may temporarily retain, for example, calibration result information of the ZQ calibration operation by the semiconductor memory devices 20, 20A, 20B, and 20C.

The host interface circuit 15 is connected to the host device and addresses communication with the host device. The host interface circuit 15, for example, transfers a command and data received from the host device to the processor 11 and the buffer memory 14, respectively.

Subsequently, a configuration example of the semiconductor memory device according to the present embodiment will be described with reference to FIG. 2. Note that the semiconductor memory devices 20, 20A, 20B, and 20C include similar configurations, for example. Therefore, in the following description, of the semiconductor memory devices 20, 20A, 20B, and 20C, the configuration of the semiconductor memory device 20 will be described, and the descriptions of the configurations of the semiconductor memory devices 20A, 20B, and 20C will be omitted.

Figure 2:
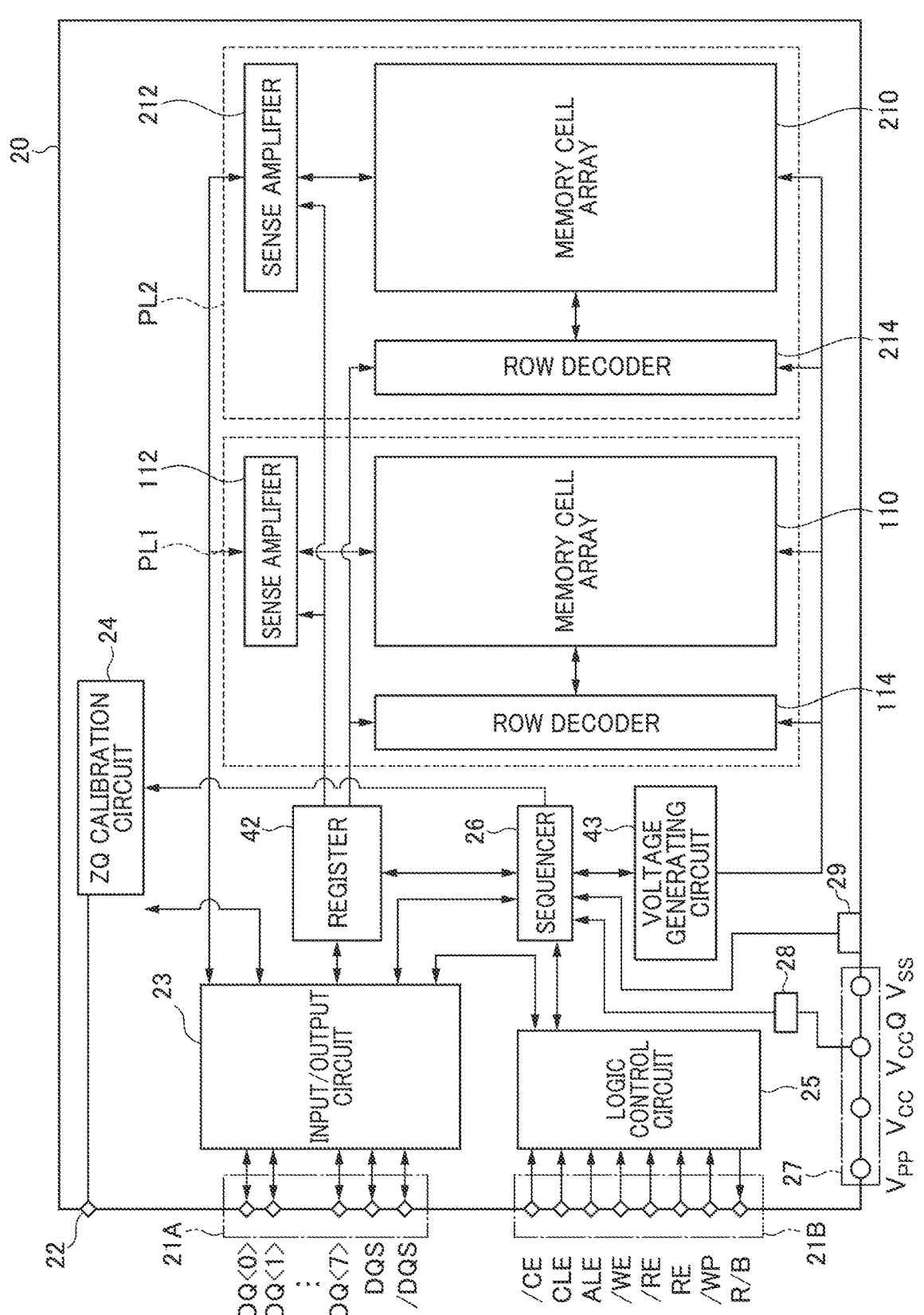
FIG. 2 is a block diagram for explaining the configuration of a semiconductor memory device according to the embodiment.

As shown in FIG. 2, the semiconductor memory device 20 includes two planes PL1 and PL2, an input/output circuit 23, a logic control circuit 25, a sequencer 26, a register 42, a voltage generating circuit 43, a group of pads for input/output 21A, a group of pads for logic control 21B, a group of terminals for power input 27, a VCCQ acquiring circuit 28, a temperature acquiring circuit 29, a ZQ pad 22, and a ZQ calibration circuit 24.

The plane PL1 includes a memory cell array 110, a sense amplifier 112, and a row decoder 114. The plane PL2 includes a memory cell array 210, a sense amplifier 212, and a row decoder 214. The configuration of the plane PL1 and the configuration of the plane PL2 are identical to each other. The configuration of the memory cell array 110 and the configuration of the memory cell array 210 are identical to each other. The configuration of the sense amplifier 112 and the configuration of the sense amplifier 212 are identical to each other. The configuration of the row decoder 114 and the configuration of the row decoder 214 are identical to each other. The number of planes provided in the semiconductor memory device 20 may be two as in the present embodiment, but may also be one, or three or more.

The memory cell array 110 and the memory cell array 210 are portions that store data. The memory cell array 110 and the memory cell array 210 each include a plurality of memory cell transistors associated with word lines and bit lines.

The input/output circuit 23 transmits and receives the signal DQ<7:0> and the data strobe signals DOS, /DQS to and from the controller 10. The input/output circuit 23 transfers a command and an address in the signal DQ<7:0> to the register 42. The input/output circuit 23 transmits and receives write data and read data to and from the sense amplifier 112 and the sense amplifier 212. The input/output circuit 23 has both functions as an "input circuit" that receives commands and the like from the controller 10 and as an "output circuit" that outputs data to the controller 10. In place of such an aspect, the input circuit and the output circuit may be in such an aspect as being configured as separate circuits from each other.

The logic control circuit 25 receives, from the controller 10, the chip enable signal /CE, the command latch enable signal CLE, the address latch enable signal ALE, the write enable signal /WE, the read enable signals RE and /RE, and the write protect signal /WP. Further, the logic control circuit 25 transfers the ready/busy signal R/B to the controller 10 to externally notify the status of the semiconductor memory device 20.

The input/output circuit 23 and the logic control circuit 25 are both circuits configured as portions where signals are input/output from/to the controller 10. That is, the input/output circuit 23 and the logic control circuit 25 are provided as interface circuits of the semiconductor memory device 20.

The sequencer 26 controls operations of components such as the planes PL1 and PL2 and the voltage generating circuit

43 based on the control signals input from the controller 10 to the semiconductor memory device 20. The sequencer 26 corresponds to a "control circuit" that controls the operations of the memory cell arrays 110, 210 and the like. Both of the sequencer 26 and the logic control circuit 25 can also be regarded as the "control circuit."

The register 42 is a portion that temporarily retains commands and addresses. The register 42 is a portion that also retains status information indicating the status of each of the planes PL1 and PL2. The status information is output, as a status signal, from the input/output circuit 23 to the controller 10 in response to a request from the controller 10.

The voltage generating circuit 43 is a portion that generates voltage required for each operation of writing, reading, and erasing data in the memory cell arrays 110, 210, based on an instruction from the sequencer 26. Such voltage includes, for example, voltage such as VPGM, VPASS PGM, or VPASS READ, which is applied to word lines, and voltage applied to bit lines. The voltage generating circuit 43 can apply voltage individually to word lines and bit lines so as to allow the plane PL1 and the plane PL2 to operate in parallel.

The group of pads for input/output 21A is a portion provided with a plurality of terminals (pads) for transmitting and receiving signals between the controller 10 and the input/output circuit 23. The terminals are individually provided corresponding to the respective signal DQ<7:0> and data strobe signals DOS and/DQS. For example, when the controller 10 and the semiconductor memory device 20 are connected in such a manner as enabling an 8-bit signal DQ<7:0> to be transmitted and received, the group of pads for input/output 21A includes eight terminals (pads) corresponding to the signal DQ<7:0> and two terminals (pads) corresponding to the signal DQ and the signal/DQS.

The group of pads for logic control 21B is a portion provided with a plurality of terminals (pads) for transmitting and receiving signals between the controller 10 and the logic control circuit 25. The terminals are individually provided corresponding to the respective chip enable signal /CE, command latch enable signal CLE, address latch enable signal ALE, write enable signal /WE, read enable signals RE, /RE, write protect signal /WP, and ready/busy signal R/B.

The group of terminals for power input 27 is a portion provided with a plurality of terminals for receiving application of voltage required for the operations of the semiconductor memory device 20. The voltage applied to each terminal includes power supply voltages VCC, VCCQ, and VPP, and a ground voltage VSS.

The power supply voltage VCC is a circuit power supply voltage externally provided as an operation power supply, and is, for example, a voltage of around 3.3 V. The power supply voltage VCCQ is, for example, a voltage of 1.2 V. The power supply voltage VCCQ is a voltage used for transmitting and receiving signals between the controller 10 and the semiconductor memory device 20. The power supply voltage VPP is a power supply voltage with a higher voltage than the power supply voltage Vcc, and is, for example, a voltage of 12 V.

The ZQ pad 22 is connected, at one end, to the ZQ calibration circuit 24. The ZQ pad 22 can be recognized, externally from the semiconductor memory device 20, as one output terminal having a certain output impedance.

The ZQ calibration circuit 24 has a function of executing the ZQ calibration operation that calibrates the output impedance of the semiconductor memory device 20 based on an external resistor. The details of the ZQ calibration circuit 24 will be described later. In the present embodiment, a reference resistor is provided as the external resistor connected to the ZQ pad 22.

Subsequently, the configurations of the input/output circuit and the ZQ calibration circuit of the semiconductor memory device according to the present embodiment will be described.

Figure 3:
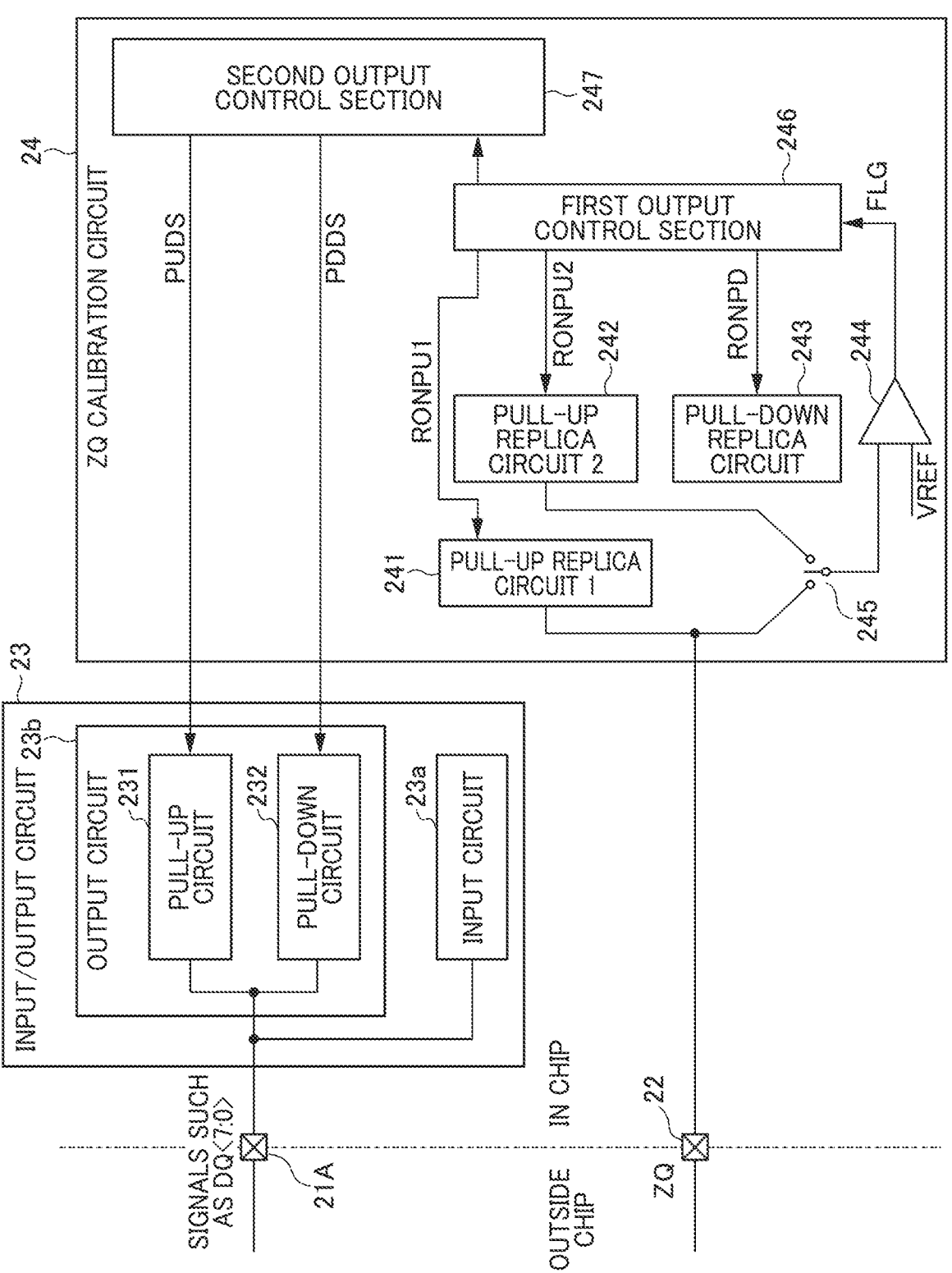
FIG. 3 is a block diagram for explaining the configurations of an input/output circuit and a ZQ calibration circuit according to the embodiment.

The configurations of the input/output circuit 23 and the ZQ calibration circuit 24 according to the present embodiment will be described with reference to FIG. 3. As shown in FIG. 3, the input/output circuit 23 includes an input circuit 23*a* and an output circuit 23*b* that are provided corresponding to each signal DQ<7:0> of the group of pads for input/output 21A. For example, when the controller 10 and the semiconductor memory device 20 are connected in such a manner as enabling an 8-bit signal DQ<7:0> to be transmitted and received, the input/output circuit 23 includes eight input circuits 23*a* and eight output circuits 23*b* corresponding to the signal DQ<7:0> and two input circuits 23*a* and two output circuits 23*b* corresponding to the signal DQ and the signal /DQS.

The input circuit 23*a*, for example, receives an input signal DQ that is input via the group of pads for input/output 21A and outputs write data to the sense amplifiers 112, 212. The output circuit 23*b*, for example, receives read data from the sense amplifiers 112, 212 and outputs an output signal DQ via the group of pads for input/output 21A.

The ZQ calibration circuit 24 includes a pull-up replica circuit 1_241, a pull-up replica circuit 2_242, a pull-down replica circuit 243, a comparator 244, a switch 245, a first output control section 246, and a second output control section 247.

The ZQ calibration circuit 24, for example, adjusts the drive power for a pull-up circuit 231 and a pull-down circuit 232 that are included in the output circuit 23*b*.

Upon receipt of an impedance control signal RONPU1 from the first output control section 246, the pull-up replica circuit 1_241 changes the impedance at an output end in accordance with the received impedance control signal RONPU1. The output end of the pull-up replica circuit 1_241 is connected to the ZQ pad 22. The pull-up replica circuit 1_241 transfers a voltage VP to a first input end of the comparator 244 via the switch 245 in accordance with the magnitude of the impedance at the output end. The voltage VP is determined based on the magnitude ratio between the output impedance of the pull-up replica circuit 1_241 and the impedance of the reference resistor.

The pull-up replica circuit 2_242 has practically the same configuration as that of the pull-up replica circuit 1_241. Upon receipt of an impedance control signal RONPU2 from the first output control section 246, the pull-up replica circuit 2_242 changes the impedance at an output end in accordance with the received impedance control signal RONPU2. The pull-up replica circuit 2_242 is adjusted so as to have substantially the same output impedance as that of the pull-up replica circuit 1_241, with the impedance control signal RONPU2.

Upon receipt of an impedance control signal RONPD from the first output control section 246, the pull-down replica circuit 243 changes the impedance at an output end in accordance with the received impedance control signal RONPD. The output end of the pull-down replica circuit 243 is connected to the pull-up replica circuit 2_242. The pull-down replica circuit 243 transfers a voltage VP to the first input end of the comparator 244 via the switch 245 in accordance with the magnitude of the impedance at the output end. The voltage VP is determined based on the magnitude ratio between the output impedance of the pull-down replica circuit 243 and the impedance of the pull-up replica circuit 2_242.

The comparator 244 compares the voltages at the first input end and a second input end and sends out an output signal in accordance with the comparison result to the first output control section 246.

The comparator 244 is supplied, at its first input end, with the voltage VP of the switch 245 and at its second input end, with a voltage VREF. For example, the comparator 244 sends out an output signal FLG at an H (High) level when the voltage VP is higher than the voltage VREF, and sends out the output signal FLG at an L (Low) level when the voltage VP is lower than the voltage VREF.

Note that the voltage VREF is set so as to be an intermediate value between the voltage VCCQ and the voltage VSS, for example. That is, in this case, the relationship among the voltage VREF, the voltage VCCQ, and the voltage VSS satisfies "VREF=(VCCQ-VSS)/2." The voltage VCCQ is a power supply voltage supplied from the semiconductor memory device 20 in the ZQ calibration operation and is greater than the voltage VSS. The voltage VSS is a ground voltage and is, for example, 0 V.

Subsequently, the configuration of the replica circuit in the ZQ calibration circuit of the semiconductor memory device according to the present embodiment will be described by taking the pull-up replica circuit 1_241 as an example.

The pull-up replica circuit 1_241 includes, for example, five transistors and a resistor. The number of transistors in the pull-up replica circuit 1_241 corresponds to the number of bits of the impedance control signal RONPU1 and any number of transistors, without being limited to five, is applicable in accordance with the number of bits of the impedance control signal RONPU1.

The transistors are p-channel MOS (Metal Oxide Semiconductor) transistors and are connected in parallel between the power supply of the voltage VCCQ and one end of the resistor. That is, the transistors are each supplied, at one end, with the voltage VCCQ and are each connected, at the other end, to one end of the resistor. The impedance control signal RONPU1 is input to the gate of each transistor. The other end of the resistor is connected to the ZQ pad 22.

With the impedance control signal RONPU1, a transistor to be turned on among the transistors is selected. The impedance control signal RONPU1 at an L (Low) level can turn on the transistor, and at an H (High) level can turn off the transistor. The transistors have, for example, different sizes (on-resistances). Therefore, for the transistors, any of the different on-resistances can be selected depending on the impedance control signal RONPU1 that varies in accordance with the output signal FLG of the comparator.

With the aforementioned configuration, the pull-up replica circuit 1_241 can set, as an output impedance, a composite resistance of the transistor selected to have the on-resistance depending on the impedance control signal RONPU1 and the resistor.

An example of a data input operation of the semiconductor memory device will be described with reference to FIG. 4.

Figure 4:
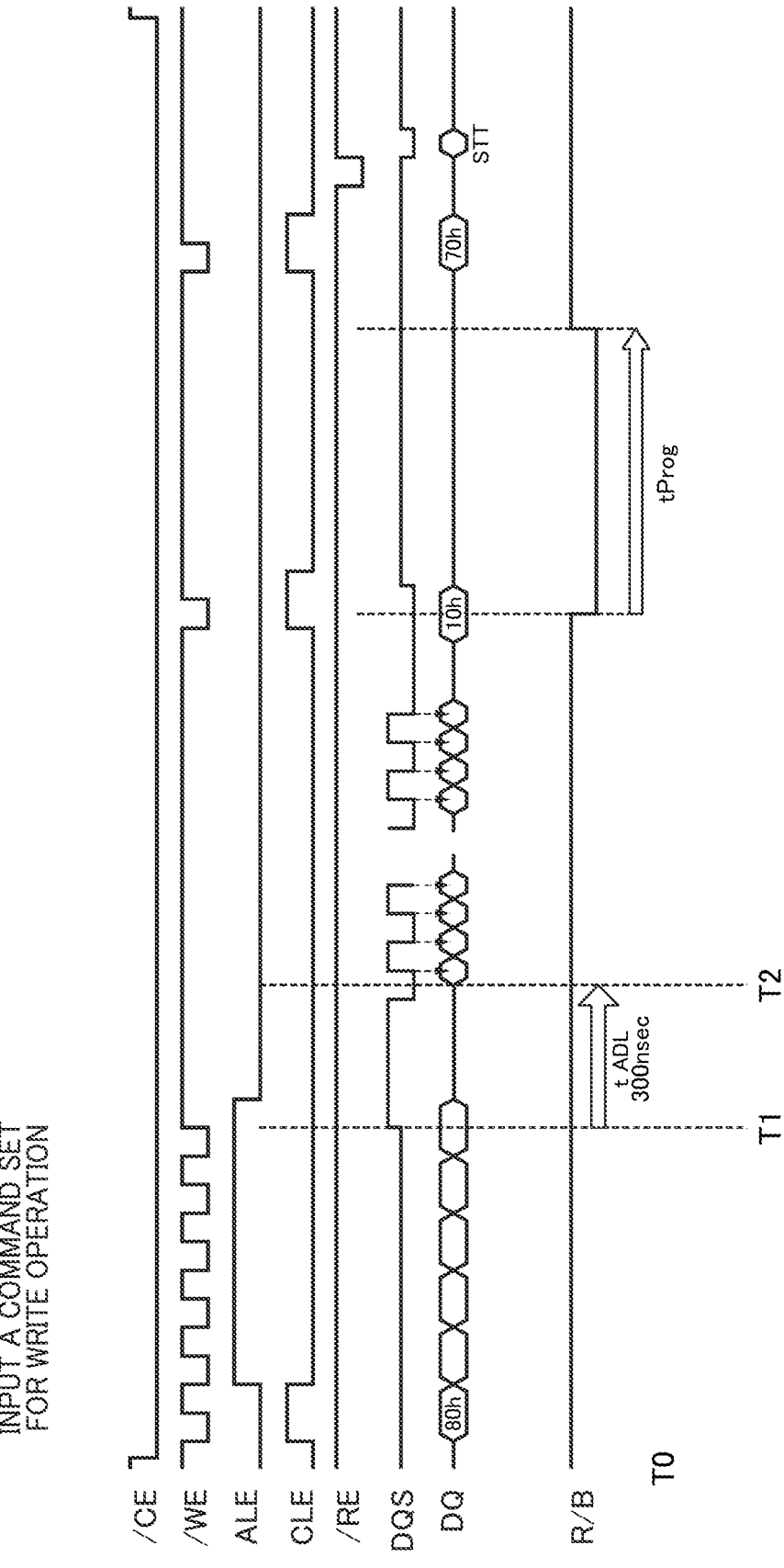
FIG. 4 is a timing chart for explaining a data input operation of the semiconductor memory device according to the embodiment.

As shown in FIG. 4, first, a command set for a write operation is input. Specifically, at time T0, the controller 10 sets the signal CLE at an H level and then, transmits a command 80*h* as the signal DQ<7:0>. More specifically, the signal corresponding to the binary number "10000000" (hexadecimal number "80") is input to each of the eight terminals corresponding to the signal DQ<7:0>. The command 80$h$ is retrieved corresponding to the rising edge of the signal /WE. Subsequently, the controller 10 sets the signal ALE at an H level and then, transmits an address as the signal DQ<7:0>. The address is transmitted over a plurality of cycles (for example, 5 cycles). The address is retrieved corresponding to the rising edge of the signal /WE. When a predetermined time tADL after time Tl when the address transmission is completed until completion of preparation for reception of the first 8-bit data has elapsed, the controller 10 retrieves data as the signal DQ<7:0> while alternately transitioning the signal DQS between an L level and an H level. The predetermined time tADL is, for example, the time required after completion of address transmission until completion of preparation for reception of the first 8-bit data in the semiconductor memory device. Thereafter, the controller 10 sets the signal CLE at an H level and then, transmits a command 10$h$ as the signal DQ<7:0>. After the command 10$h$ is retrieved corresponding to the rising edge of the signal /WE, an internal operation time tProg, during which internal operations, such as application and verification of a program voltage, are performed, elapses.

As will be described later, the ZQ calibration operation may be executed using the predetermined time tADL. On condition that the command 80$h$ is input and the address of the predetermined cycle is input, the sequencer 26 executes a short ZQ calibration operation that is shorter than the normal ZQ calibration operation.

Subsequently, with reference to FIG. 5, the configuration for receiving the signal DQ<7:0> of the input/output circuit 23 will be described.

Figure 5:
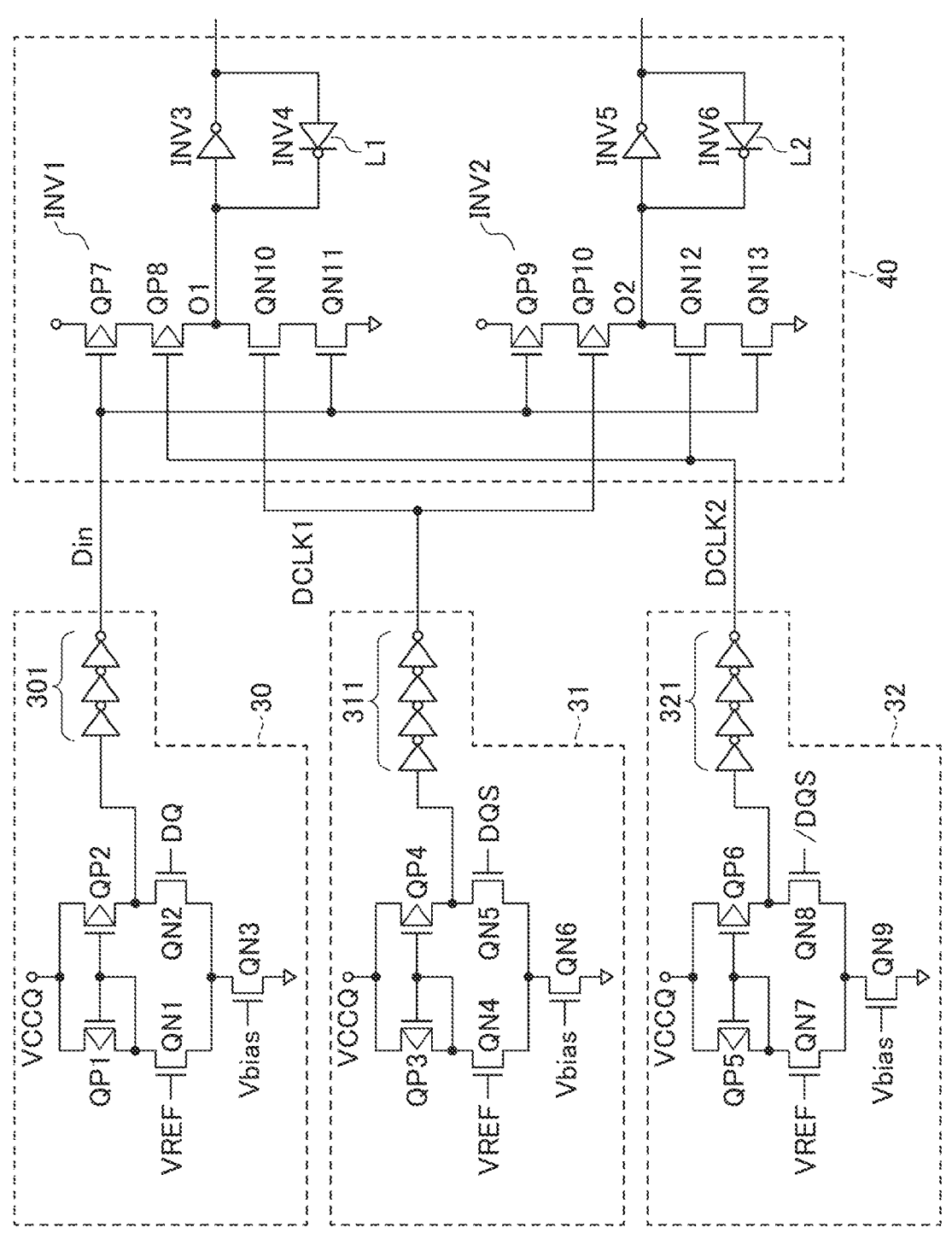
FIG. 5 is a circuit diagram showing the configuration of an input circuit.

FIG. 5 shows a first differential amplifier circuit 30, a second differential amplifier circuit 31, a third differential amplifier circuit 32, and a data latch circuit 40, as the configuration for receiving the signal DQ<7:0>. The first differential amplifier circuit 30 corresponds to the input circuit 23$a$ for the signal DQ<7:0>. The second differential amplifier circuit 31 corresponds to the input circuit 23$a$ for the signal DOS. The third differential amplifier circuit 32 corresponds to the input circuit 23$a$ for the signal /DQS. The first differential amplifier circuit 30 outputs a signal corresponding to the input signal DQ. The data latch circuit 40 retrieves the signal output from the first differential amplifier circuit 30 in accordance with the timing at which the strobe signal DOS and the strobe signal /DQS transition (toggle) between an L level and an H level.

The first differential amplifier circuit 30 is a circuit that amplifies the difference between the input signal DQ and the reference voltage VREF to output an internal data signal Din. The first differential amplifier circuit 30 includes PMOS transistors QP1, QP2, NMOS transistors QN1, QN2, QN3, and a group of inverter circuits 301. The group of inverter circuits 301 functions as a timing adjustment circuit. In FIG. 5, the group of inverter circuits 301 is illustrated as cascade-connected three inverters, but as long as the same signal logic can be obtained, the logic circuit such as a NAND gate and a NOR gate, a transmission gate, a delay circuit, and the like may be further inserted. The PMOS transistors QP1 and QP2 are connected, at their sources, to the power supply voltage terminal. The PMOS transistor QP1 is diode-connected, and further, its gate is connected to the gate of the PMOS transistor QP2.

The drains of the NMOS transistors QN1 and QN2 are respectively connected to the drains of the PMOS transistors QP1 and QP2. Further, the gates of the NMOS transistors QN1 and QN2 are respectively supplied with the reference voltage VREF and the input signal DQ. The NMOS transistor QN3 is connected between the sources of the NMOS transistors QN1 and QN2 and the ground terminal, and its gate is supplied with the bias voltage Vbias.

The first differential amplifier circuit 30 turns into an operable state, with the bias voltage Vbias supplied, and amplifies the difference between the input signal DQ and the reference voltage VREF to output a differentially-amplified signal. The differentially-amplified signal is output as the internal data signal Din via the group of inverter circuits 301 as the timing adjustment circuit. In FIG. 5, only the first operational amplifier circuit 30 (input circuit 23$a$) and the data latch circuit 40 corresponding to one of the signals DQ<7:0> are described, but actually, the first differential amplifier circuit 30 (input circuit 23$a$) and the data latch circuit 40 are provided so as to correspond, in number, to the signals DQ<7:0>. For example, as shown in FIG. 2, when eight input signals DQ<7:0> are input to the semiconductor memory device 20, eight first differential amplifier circuits 30 (input circuits 23$a$) and eight data latch circuits 40 are provided.

The second differential amplifier circuit 31 has, for example, substantially the same structure as that of the first differential amplifier circuit 30. In the configuration of FIG. 5, the second differential amplifier circuit 31 amplifies the difference between the strobe signal DQS and the reference voltage VREF to output a first timing control signal DCLK1. Specifically, the second differential amplifier circuit 31 includes PMOS transistors QP3 and QP4, NMOS transistors QN4, QN5, and QN6, and a group of inverter circuits 311. The group of inverter circuits 311 functions as a timing adjustment circuit. In FIG. 5, the group of inverter circuits 311 is illustrated as cascade-connected four inverters, but as long as the same signal logic can be obtained, the logic circuit such as the NAND gate and the NOR gate, the transmission gate, the delay circuit, and the like may be further inserted. The PMOS transistors QP3 and QP4 are connected, at their sources, to the power supply voltage terminal. The PMOS transistor QP3 is diode-connected, and further, its gate is connected to the gate of the PMOS transistor QP4.

The drains of the NMOS transistors QN4 and QN5 are respectively connected to the drains of the PMOS transistors QP4 and QP5. The gates of the NMOS transistors QN4 and QN5 are respectively supplied with the reference voltage VREF and the strobe signal DOS. The NMOS transistor QN6 is connected between the sources of the NMOS transistors QN4 and QN5 and the ground terminal, and its gate is supplied with the bias voltage Vbias. The second differential amplifier circuit 31 turns into an operable state, with the bias voltage Vbias supplied, and amplifies the difference between the strobe signal DOS and the reference voltage VREF to output a differentially-amplified signal. The differentially-amplified signal is output as the first timing control signal DCLK1 via the group of inverter circuits 311 as the timing adjustment circuit.

The third differential amplifier circuit 32 also has, for example, substantially the same structure as that of the first differential amplifier circuit 30. In the configuration of FIG. 5, the third differential amplifier circuit 32 amplifies the difference between the strobe signal /DQS and the reference voltage VREF to output a second timing control signal DCLK2. Specifically, the third differential amplifier circuit 32 includes PMOS transistors QP5, QP6, NMOS transistors QN7, QN8, QN9, and a group of inverter circuits 321. The group of inverter circuits 321 functions as a timing adjustment circuit. In FIG. 5, the group of inverter circuits 321 is illustrated as cascade-connected four inverters, but as long as the same signal logic can be obtained, the logic circuit such as the NAND gate and the NOR gate, the transmission gate, the delay circuit, and the like may be further inserted. The PMOS transistors QP5 and QP6 are connected, at their sources, to the power supply voltage terminal. The PMOS transistor QP5 is diode-connected, and further, its gate is connected to the gate of the PMOS transistor QP6.

The drains of the NMOS transistors QN7 and QN8 are respectively connected to the drains of the PMOS transistors QP5 and QP6. The gates of the NMOS transistors QN7 and QN8 are respectively supplied with the reference voltage VREF and the strobe signal /DQS. The NMOS transistor QN9 is connected between the sources of the NMOS transistors QN7 and QN8 and the ground terminal, and its gate is supplied with the bias voltage Vbias. The third differential amplifier circuit 32 turns into an operable state, with the bias voltage Vbias supplied, and amplifies the difference between the strobe signal /DQS and the reference voltage VREF to output a differentially-amplified signal. The differentially-amplified signal is output as the first timing control signal DCLK2 via the group of inverter circuits 321 as the timing adjustment circuit.

The data latch circuit 40 includes inverters INV1 and INV2, a first latch circuit L1, and a second latch circuit L2.

The inverter INV1 is configured such that PMOS transistors QP7 and QP8 and NMOS transistors QN10 and QN11 are connected in series between the power supply voltage terminal and the ground voltage terminal. The inverter INV2 is configured such that PMOS transistors QP9 and QP10 and NMOS transistors QN12 and QN13 are connected in series between the power supply voltage terminal and the ground voltage terminal.

In the inverter INV1, a signal Din is input to the gates of the PMOS transistor QP7 and the NMOS transistor QN11. The aforementioned signals DCLK2, DCLK1 are input to the PMOS transistor QP8 and the NMOS transistor QN10, respectively.

In the inverter INV2, the signal Din is input to the gates of the PMOS transistor QP9 and the NMOS transistor QN13. This point is the same as the inverter INV1. However, in the inverter INV2, the signal DCLK1 is input to the gate of the MOS transistor QP10 and the signal DCLK2 is input to the gate of the NMOS transistor QN12. This point is different from and inverted from the inverter INV1.

The latch circuit L1 is formed with an inverter INV3 and an inverter INV4 that are cross-connected to each other. That is, an output terminal of the inverter INV3 is connected to an input terminal of the inverter INV4, and an output terminal of the inverter INV4 is connected to an input terminal of the inverter INV3. The inverter INV4 is a clocked inverter, and for example, turns into a non-conducting state when the signal CLK2 is at an L level and operates as an inverter when the signal CLK2 is at an H level. The input terminal of the inverter INV3 is connected to an output terminal of the inverter INV1.

The latch circuit L2 is also similarly configured with an inverter INV5 and an inverter INV6 that are cross-connected to each other. That is, an output terminal of the inverter INV5 is connected to an input terminal of the inverter INV6, and an output terminal of the inverter INV6 is connected to an input terminal of the inverter INV5. The inverter INV6 is a clocked inverter, and for example, turns into a non-conducting state when the signal CLK1 is at an L level and operates as an inverter when the signal CLK2 is at an H level. The input terminal of the inverter INV5 is connected to an output terminal of the inverter INV2.

Figure 6:
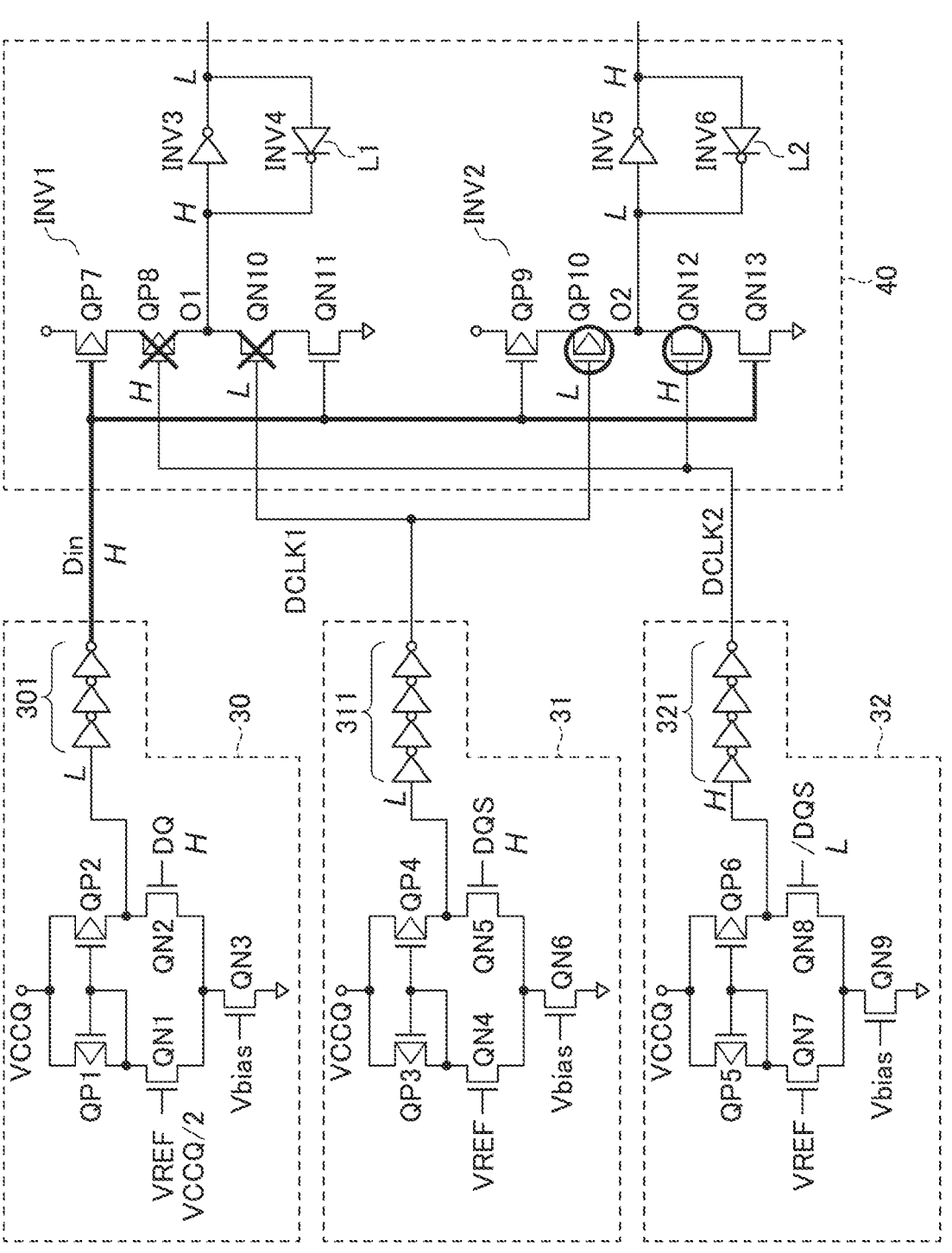
FIG. 6 is a circuit diagram showing the configuration of the input circuit.

With reference to FIG. 6, the operation of the first differential amplifier circuit 30 will be described. FIG. 6 shows that a signal at an H (High) level is input as the input signal DQ. As described above, the first differential amplifier circuit 30 amplifies the difference between the reference voltage VREF and the input signal DO to output the signal Din. The reference voltage VREF is a voltage fixed at a voltage value that is around a half of the amplitude of the input signal DQ. When the input signal DQ falls from the H level (power supply voltage VCCQ) toward the L level (ground voltage VSS) to be equal to or lower than the reference voltage VREF, the signal Din rises from the L level to the H level. Conversely, when the input signal DQ rises from the L level toward the H level to be greater than the reference voltage VREF, the signal Din falls from the H level to the L level.

Subsequently, the operation of the second differential amplifier circuit 31 will be described. The second differential amplifier circuit 31 amplifies the difference between the reference voltage VREF and the strobe signal DOS to output the signal DCLK1. FIG. 6 shows a state that the strobe signal DOS is at an H (High) level. As described above, the second differential amplifier circuit 31 amplifies the difference between the reference voltage VREF and the strobe signal DQS to output the signal DCLK1. When the strobe signal DOS falls from the H level (power supply voltage VCCQ) toward the L level (ground voltage VSS) to be equal to or lower than the reference voltage VREF, the signal DCLK1 rises from the L level to the H level. Conversely, when the strobe signal DOS rises from the L level toward the H level to be greater than the reference voltage VREF, the signal DCLK1 falls from the H level to the L level.

Subsequently, the operation of the third differential amplifier circuit 32 will be described. The third differential amplifier circuit 32 amplifies the difference between the reference voltage VREF and the strobe signal /DQS to output the signal DCLK2. FIG. 6 shows a state that the strobe signal 2DQS at an L (Low) level. As described above, the third differential amplifier circuit 32 amplifies the difference between the reference voltage VREF and the strobe signal /DQS to output the signal DCLK2. When the strobe signal /DQS falls from the H level (power supply voltage VCCQ) toward the L level (ground voltage VSS) to be equal to or lower than the reference voltage VREF, the signal DCLK2 falls from the H level to the L level. Conversely, when the strobe signal /DQS falls from the H level toward the L level to be greater than the reference voltage VREF, the signal DCLK2 rises from the L level to the H level.

Subsequently, the operation of the data latch circuit 40 will be described. Hereinafter, the operation will be described by four separate cases of (1), (2), (3), and (4).

(1) Operation when Strobe Signal DOS is at H and Strobe Signal/DQS is at L

With reference to FIG. 6, the operation of the data latch circuit 40 in Case (1) will be described. In FIG. 6, since the strobe signal DOS is at H, the signal DCLK1 output from the second differential amplifier circuit 31 is at L. Since the strobe signal /DQS is at L, the signal DCLK2 output from the third differential amplifier circuit 32 is at H. Thus, the PMOS transistor QP8 and the NMOS transistor QN10 of the inverter INV1 are in a non-conducting state, and the PMOS transistor QP10 and the NMOS transistor 11 of the inverter INV2 are in a conducting state. The inverter INV4 as a clocked inverter operates as an inverter and the inverter INV6 as a clocked inverter is in a non-conducting state. Therefore, the voltage level of an output terminal O1 of the inverter INV1 is maintained by the latch circuit L1 irrespective of the voltage level of the signal Din, while the voltage level of an output terminal O2 of the inverter INV2 is set in accordance with the voltage level of the signal Din.

For example, as shown in FIG. 6, when the input signal DQ and the signal Din are switched from L to H, the voltage level of the output terminal O1 of the inverter INV1 is maintained at the voltage level (for example, H level) corresponding to the data retained by the latch circuit L1, while the voltage level of the output terminal O2 of the inverter INV2 is set at an H level in accordance with the voltage level of the signal Din. That is, data corresponding to the voltage level of the signal Din is input to the latch circuit L2.

Thereafter, the signal DQS is switched from H to L and the signal /DQS is switched from L to H, so that the signal DCLK1 output from the second differential amplifier circuit 31 turns into H, and the signal DCLK2 output from the third differential amplifier circuit 32 turns into L. Thus, the PMOS transistor QP8 and the NMOS transistor QN10 of the inverter INV1 turn into a conducting state and the PMOS transistor QP10 and the NMOS transistor 11 of the inverter INV2 turn into a non-conducting state. The inverter INV4 as a clocked inverter turns into a non-conducting state, and the inverter INV6 as a clocked inverter operates as an inverter. Therefore, the data input to the latch circuit L2 is retained and is transmitted to the inside of the semiconductor memory device 20.

Figure 7:
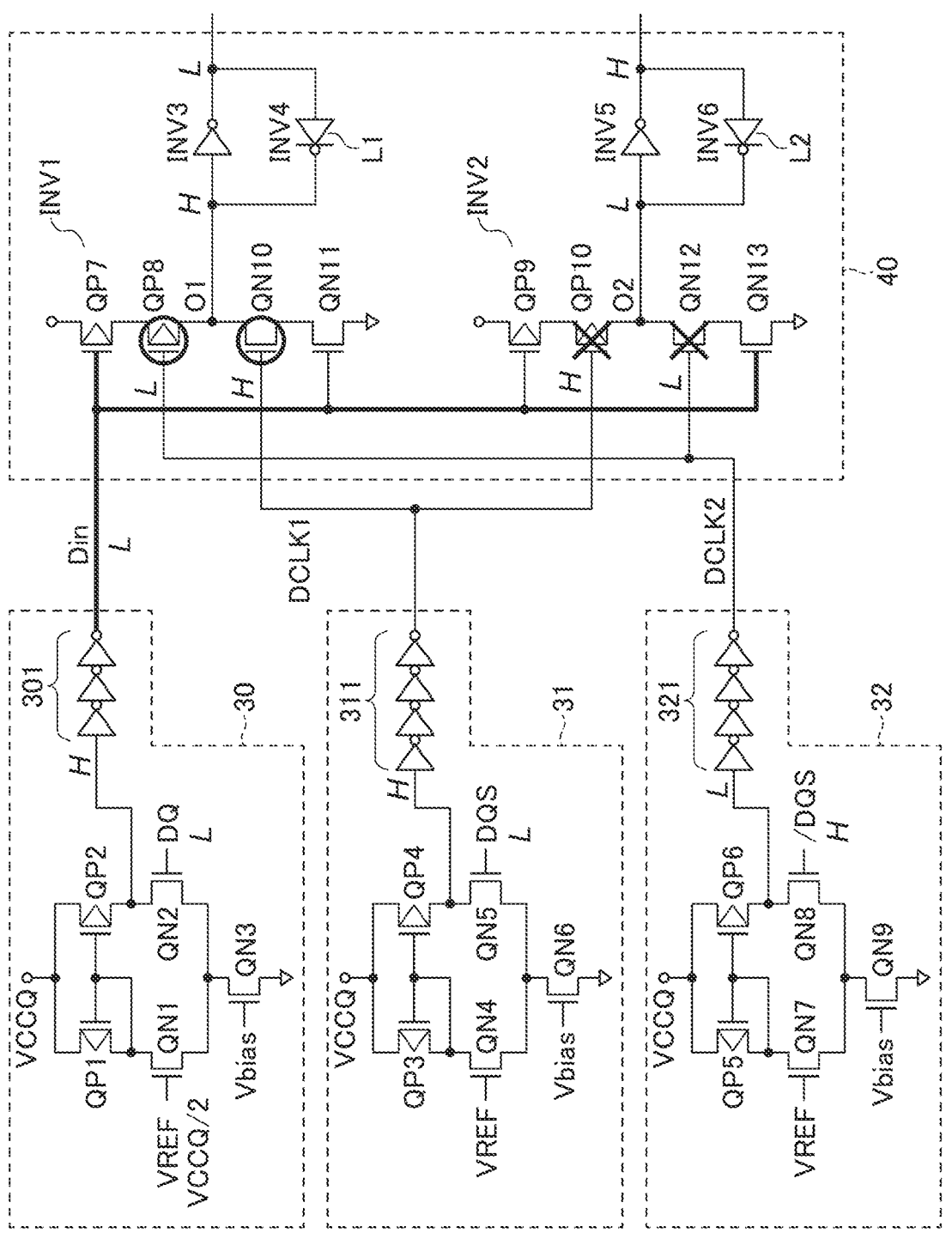
FIG. 7 is a circuit diagram showing the configuration of the input circuit.

(2) Operation after (1) and when Strobe Signal DOS is at L and Strobe Signal BDQS is at H With reference to FIG. 7, the operation of the data latch circuit 40 in Case (2) will be described. In Case (2), as described above, since the signal DQS is switched from H to L and the signal /DQS is switched from L to H, the PMOS transistor QP8 and the NMOS transistor QN10 of the inverter INV1 are in a conducting state, and the PMOS transistor QP10 and the NMOS transistor 11 of the inverter INV2 are in a non-conducting state. At this timing, as shown in FIG. 7, when the input signal DQ and the signal Din are switched from H to L, the transistor QP7 of the inverter INV1 is switched from a non-conducting state to a conducting state, and the NMOS transistor QN11 of the inverter INV1 is switched from a conducting state to a non-conducting state. Thus, the voltage level of the output terminal O2 of the inverter INV2 is maintained at a voltage level (for example, L level) corresponding to the data retained by the latch circuit L2, while the voltage level of the output terminal O1 of the inverter INV1 is set at an H level in accordance with the voltage level of the signal Din. That is, data corresponding to the voltage level of the signal Din is input to the latch circuit L2.

Thereafter, the strobe signal DOS is switched from L to H and the strobe signal /DQS is switched from H to L, so that the signal DCLK1 output from the second differential amplifier circuit 31 turns into L, and the signal DCLK2 output from the third differential amplifier circuit 32 turns into H. Thus, the PMOS transistor QP8 and the NMOS transistor QN10 of the inverter INV1 turn into a non-conducting state and the PMOS transistor QP10 and the NMOS transistor 11 of the inverter INV2 turn into a conducting state. The inverter INV4 as a clocked inverter operates as an inverter and the inverter INV6 as a clocked inverter turns into a non-conducting state. Therefore, the data input to the latch circuit L1 is retained and is transmitted to the inside of the semiconductor memory device 20.

Figure 8:
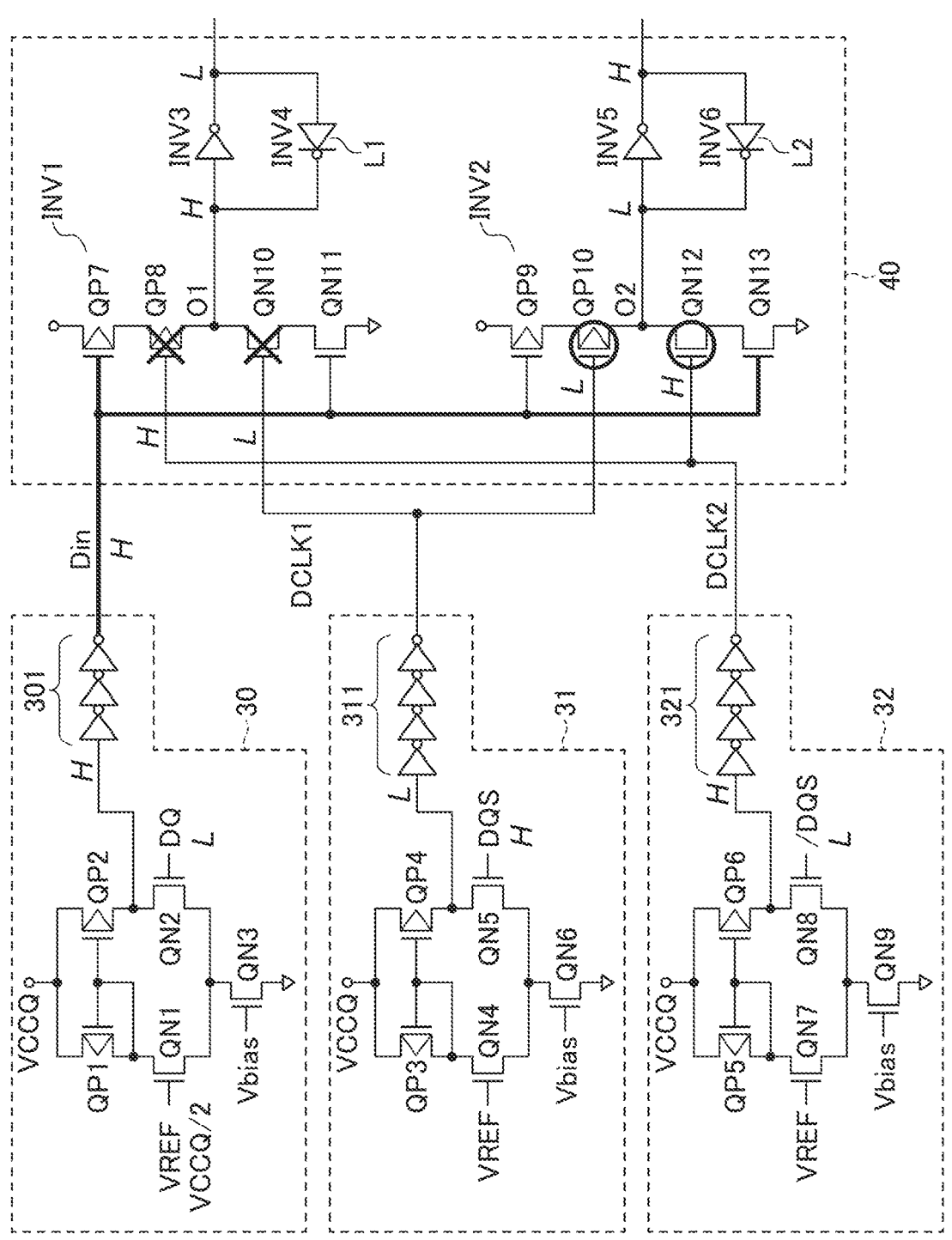
FIG. 8 is a circuit diagram showing the configuration of the input circuit.

(3) Operation after (2) and when Strobe Signal DOS is at H and Strobe Signal BDQS is at L With reference to FIG. 8, the operation of the data latch circuit 40 in Case (3) will be described. Also in Case (3), as in Case (1), since the signal DQS is switched from L to H and the signal /DQS is switched from H to L, the PMOS transistor QP8 and the NMOS transistor QN10 of the inverter INV1 are in a non-conducting state, and the PMOS transistor QP10 and the NMOS transistor 11 of the inverter INV2 are in a conducting state. At this timing, as shown in FIG. 8, when the input signal DQ and the signal Din are maintained at L, the transistor QP9 of the inverter INV2 turns into a conducting state, and the NMOS transistor QN13 of the inverter INV2 turns into a non-conducting state. Thus, the voltage level of the output terminal O1 of the inverter INV1 is maintained at a voltage level (for example, H level) corresponding to the data retained by the latch circuit L1, while the voltage level of the output terminal O2 of the inverter INV2 is set at an H level in accordance with the voltage level of the signal Din. That is, data corresponding to the voltage level of the signal Din is input to the latch circuit L2.

Thereafter, the signal DOS is switched from H to L and the signal /DQS is switched from L to H, so that the signal DCLK1 output from the second differential amplifier circuit 31 turns into H, and the signal DCLK2 output from the third differential amplifier circuit 32 turns into L. Thus, the PMOS transistor QP8 and the NMOS transistor QN10 of the inverter INV1 turn into a conducting state and the PMOS transistor QP10 and the NMOS transistor 11 of the inverter INV2 turn into a non-conducting state. The inverter INV4 as a clocked inverter turns into a non-conducting state and the inverter INV6 as a clocked inverter operates as an inverter. Therefore, the data input to the latch circuit L2 is retained and is transmitted to the inside of the semiconductor memory device 20.

Figure 9:
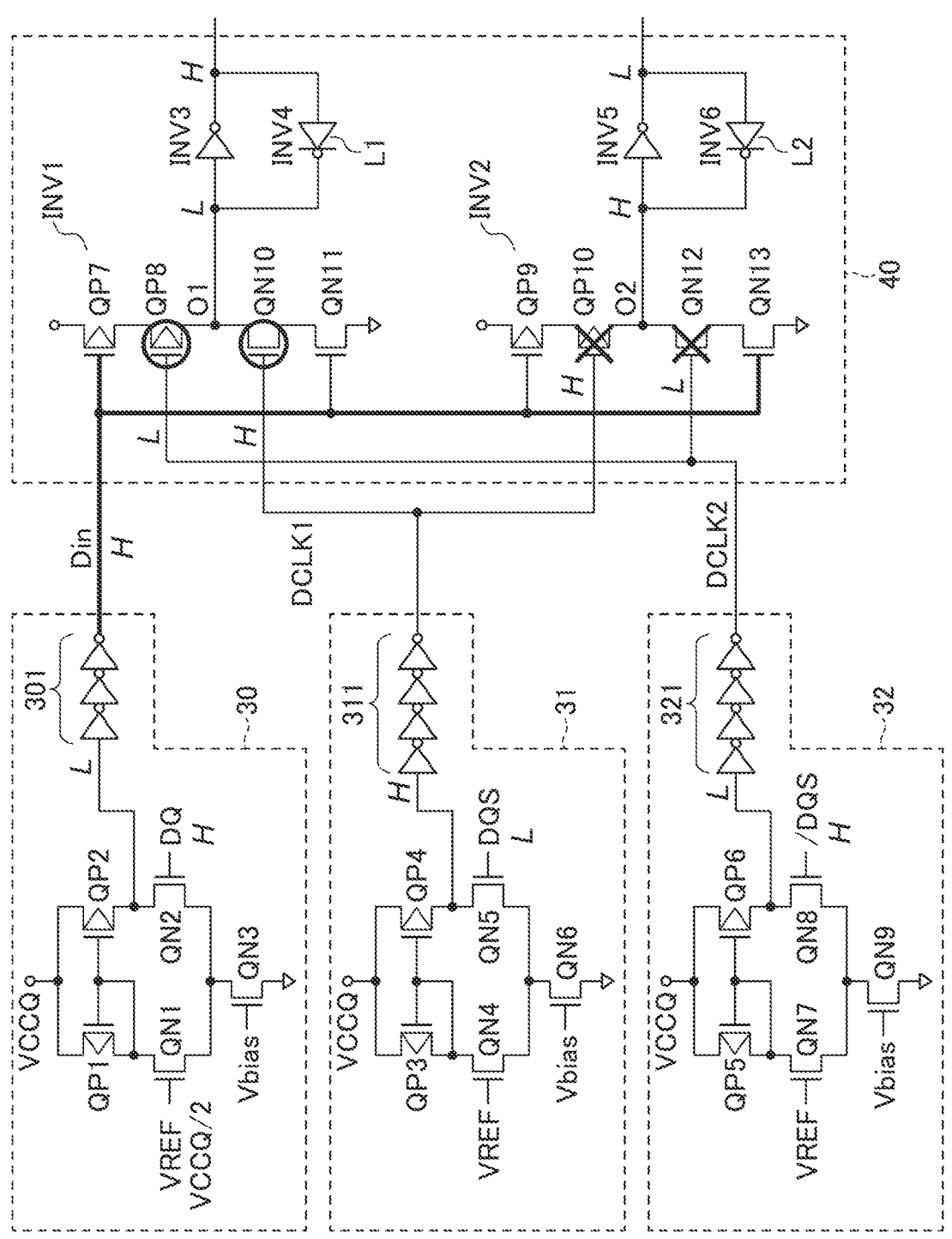
FIG. 9 is a circuit diagram showing the configuration of the input circuit.

(4) Operation after (3) and when Strobe Signal DOS is at L and Strobe Signal BDQS is at H With reference to FIG. 9, the operation of the data latch circuit 40 in Case (4) will be described. Also in Case (4), as in Case (2), since the signal DOS is switched from H to L and the signal /DQS is switched from L to H, the PMOS transistor QP8 and the NMOS transistor QN10 of the inverter INV1 are in a conducting state, and the PMOS transistor QP10 and the NMOS transistor 11 of the inverter INV2 are in a non-conducting state. At this timing, as shown in FIG. 9, when the input signal DQ and the signal Din are switched from L to H, the transistor QP7 of the inverter INV1 turns into a non-conducting state, and the NMOS transistor QN11 of the inverter INV1 turns into a conducting state. Thus, the voltage level of the output terminal O2 of the inverter INV2 is maintained at a voltage level (for example, H level) corresponding to the data retained by the latch circuit L2, while the voltage level of the output terminal O1 of the inverter INV1 is set at an L level in accordance with the voltage level of the signal Din. That is, data corresponding to the voltage level of the signal Din is input to the latch circuit L2.

Thereafter, the strobe signal DQS is switched from L to H and the strobe signal /DQS is switched from H to L, so that the signal DCLK1 output from the second differential amplifier circuit 31 turns into L, and the signal DCLK2 output from the third differential amplifier circuit 32 turns into H. Thus, the PMOS transistor QP8 and the NMOS transistor QN10 of the inverter INV1 turn into a non-conducting state and the PMOS transistor QP10 and the NMOS transistor 11 of the inverter INV2 turn into a conducting state. The inverter INV4 as a clocked inverter operates as an inverter and the inverter INV6 as a clocked inverter turns into a non-conducting state. Therefore, the data input to the latch circuit L1 is retained and is transmitted to the inside of the semiconductor memory device 20.

Figure 10:
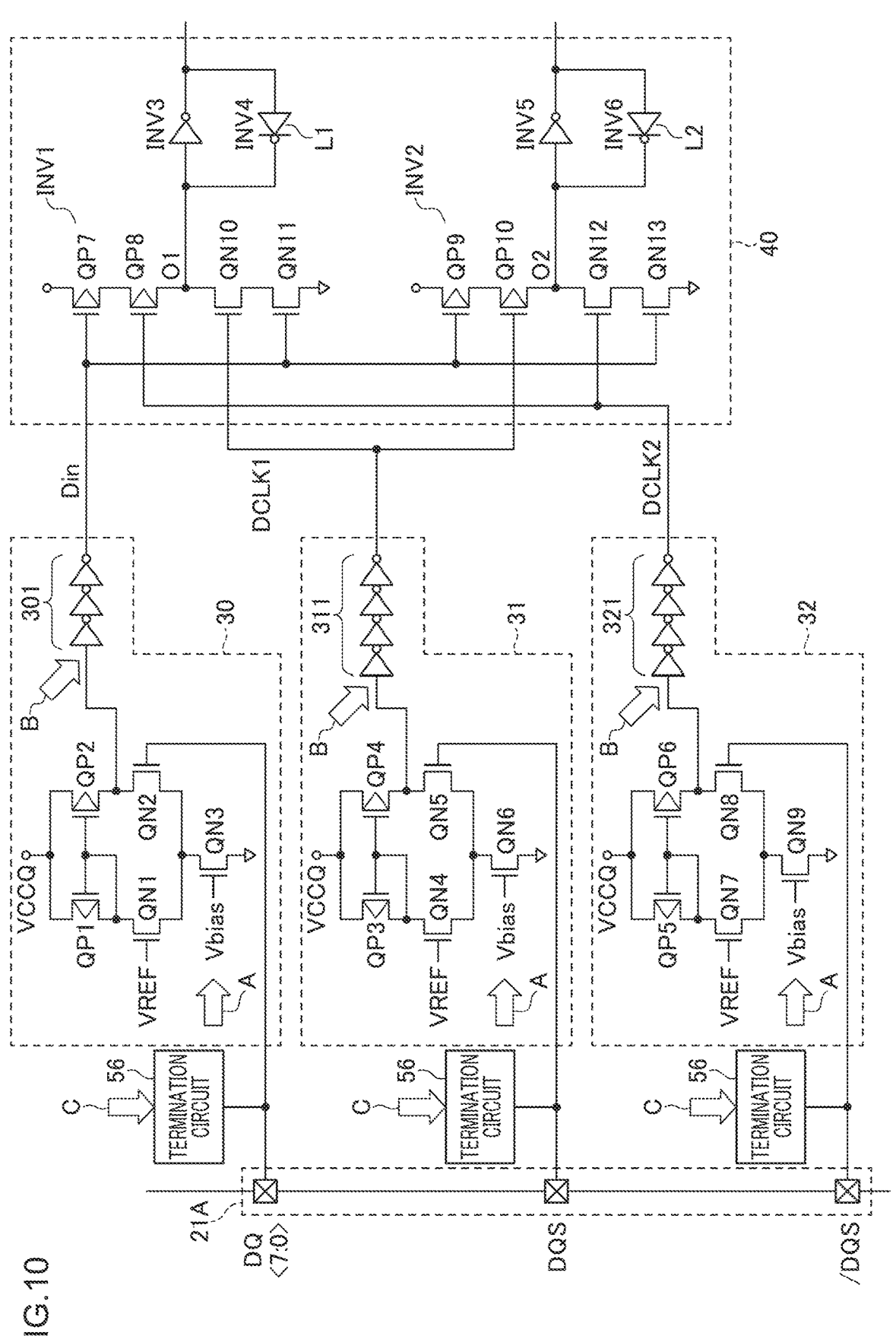
FIG. 10 is a circuit diagram showing the configuration of the input circuit.

FIG. 10 is a diagram showing the portions where the circuit characteristics are adjusted in the input/output circuit 23 of the present embodiment. In the present embodiment, portions indicated by arrows A (NMOS transistors QN3, QN6, and QN9) and portions indicated by arrows B (groups of inverter circuits 301, 311, 321) are adjusted in accordance with the fluctuation of the VCCQ. Portions indicated by arrows C (termination circuits 56) are adjusted in accordance with the fluctuation of the operation temperature.

Figure 11:
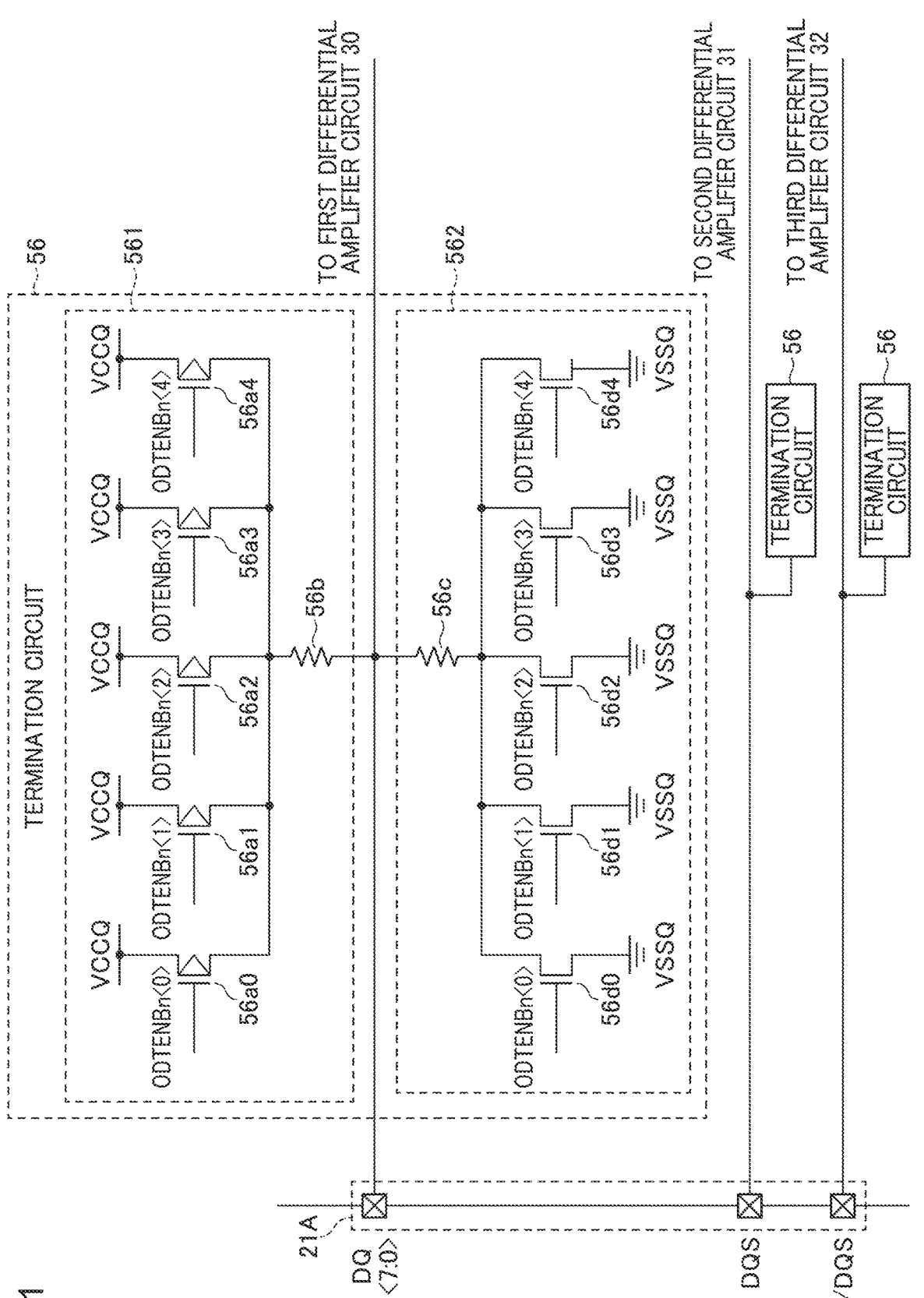
FIG. 11 is a circuit diagram schematically showing a termination circuit.

FIG. 11 is a circuit diagram schematically showing the basic circuit of the termination circuit 56 shown in FIG. 10. The termination circuit 56 is also referred to as an ODT (On Die Termination) circuit. Referring to FIG. 11, the circuit configuration of each terminal (pad) of the group of pads for input/output 21A and the termination circuit 56 will be schematically described.

As shown in FIG. 11, the group of pads for input/output 21A includes a plurality of input/output terminals corresponding to the signal DQ<7:0>, the signal DQS, and the signal /DQS. The plurality of termination circuits 56 are provided corresponding to the plurality of input/output terminals (pads).

As shown in FIG. 11, the termination circuit 56 includes a pull-up circuit 561 and a pull-down circuit 562.

The pull-up circuit 561 includes a plurality of p-type transistors $56a0$ to $56a4$, in which the VCCQ is applied to one end of the current path and a resistor element $56b$ is connected to the other end of the current path, the plurality of p-type transistors $56a0$ to $56a4$ having different sizes and connected in parallel to one another, and the resistor element $56b$ that is connected, at the other end, to the input/output terminal. Specifically, the size ratios among the p-type transistors $56a0$, $56a1$, $56a2$, $56a3$, and $56a4$ are 1:2:4:8:16. Signals ODTENBn applied to the p-type transistors $56a0$, $56a1$, $56a2$, $56a3$, and $56a4$ are ODTENBn<0>, ODTENBn<1>, ODTENBn<2>, ODTENBn<3>, and ODTENBn<4>, respectively.

The pull-down circuit 562 includes a plurality of n-type transistors $56d0$ to $56d4$, in which a resistor element $56c$ is connected to one end of the current path and the ground potential VSSQ is applied to the other end of the current path, the plurality of n-type transistors $56d0$ to $56d4$ having different sizes and connected in parallel to one another, and the resistor element $56c$. For example, the size ratios among the n-type transistors $56d0$, $56d1$, $56d2$, $56d3$, and $56d4$ are 1:2:4:8:16. Note that the p-type transistor $56a0$ and the n-type transistor $56d0$ do not need to be the same in size. That is, the size ratios among the p-type transistors $56a0$ to $56a4$ and the size ratios of the n-type transistors $56d0$ to $56d4$ may be independent from each other. The signals ODTENB applied to the gates of the n-type transistors $56d0$, $56d1$, $56d2$, $56d3$, and $56d4$ are ODTENB<0>, ODTENB<1>, ODTENB<2>, ODTENB<3>, and ODTENB<4>, respectively.

Note that when the p-type transistors $56a0$ to $56a4$ are not distinguished from one another, the p-type transistors $56a0$ to $56a4$ are referred to as a p-type transistor $56a$. When the n-type transistors $56d0$ to $56d4$ are not distinguished from one another, the n-type transistors $56d0$ to $56d4$ are referred to as an n-type transistor $56d$. The size ratios among the p-type transistors $16a$ and the size ratios among the n-type transistors $16d$ are powers of two, but are not necessarily limited thereto. The number of the p-type transistors $16a$ and the number of the n-type transistors $16d$ are five each, but are not necessarily limited thereto. An example of the size is, for example, a gate width, and the size only needs to satisfy the aforementioned ratio of the current drive power.

Figure 13:
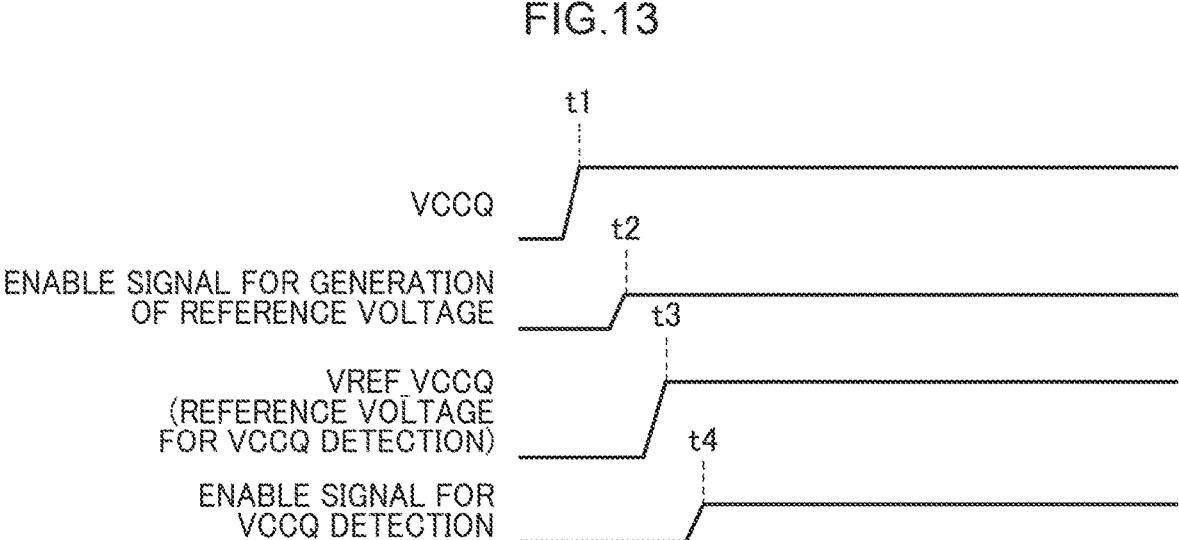
FIG. 13 is a timing chart of the case in which constant VCCQ detection is performed.
Figure 16:
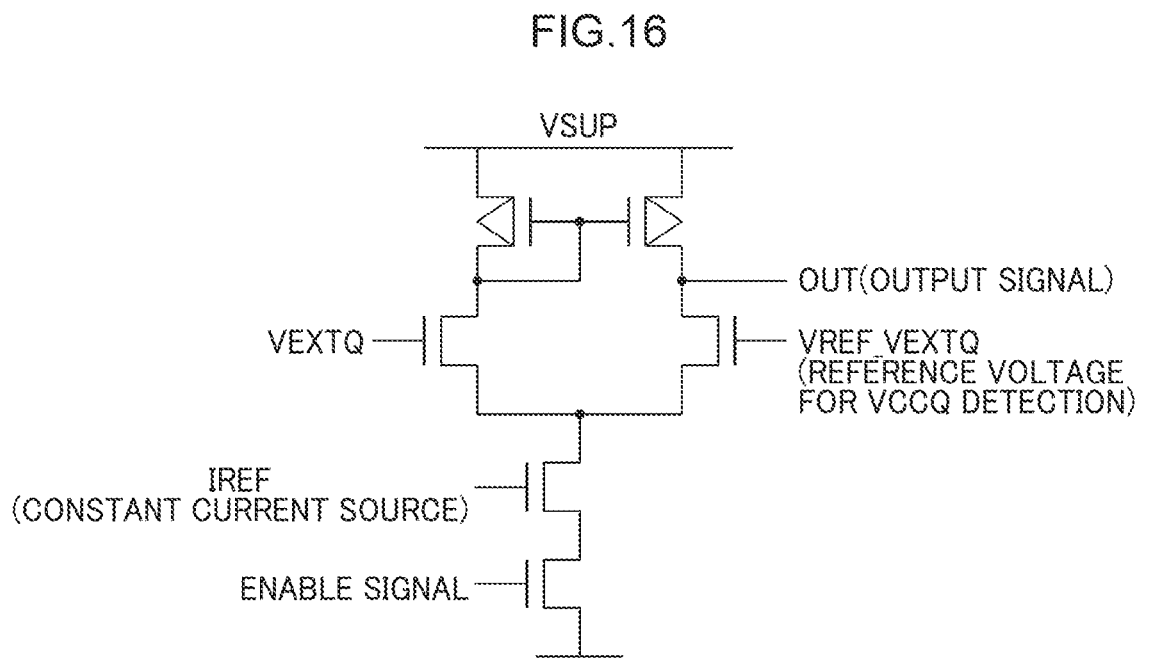

First, adjustment between the portions indicated by the arrows A (NMOS transistors QN3, QN6, and QN9) and the portions indicated by the arrows B (groups of inverter circuits 301, 311, and 321) in FIG. 10 will be described. FIG. 12 is a flowchart of a case in which constant VCCQ detection is performed. FIG. 13 is a timing chart of the case in which the constant VCCQ detection is performed. FIG. 16 is a circuit diagram for explaining VCCQ detection. Referring to FIG. 12, FIG. 13, and FIG. 16, the constant VCCQ detection will be described. The circuit diagram shown in FIG. 16 corresponds to the portions indicated by the arrows A in FIG. 10.

When power supply is input, the voltage VCC, the voltage VCCQ, and the like are supplied to the group of terminals for power input 27 from the outside of the semiconductor memory device 20. Thereafter, the voltage generating circuit 43 starts generating a reference voltage VREF_VCCQ for the VCCQ detection (step S001 of FIG. 12, from t1 to t2 of FIG. 13). In step S002 subsequent to step S001, the voltage generating circuit 43 completes the generation of the reference voltage VREF_VCCQ for the VCCQ detection (from t3 to t4 of FIG. 13).

In step S003 subsequent to step S002, it is determined whether the state is stand-by. If the stand-by state is determined (step S003: YES), the process proceeds to the processing of step S004.

In step S004, it is determined whether the voltage VCCQ externally supplied is equal to or lower than the reference voltage VREF_VCCQ. When the VCCQ is equal to or lower than the VREF_VCCQ (step S004: YES), the process proceeds to the processing of step S005. In step S005, the circuit characteristics are adjusted. For example, the bias voltage Vbias supplied to the NMOS transistor QN3 included in the first differential amplifier circuit 30, the NMOS transistor QN6 included in the second differential amplifier circuit 31, and the NMOS transistor QN9) included in the third differential amplifier circuit 32 is changed so that the output characteristics of the differentially-amplified signal are adjusted.

In place of changing the bias voltage Vbias or in addition to changing of the bias voltage Vbias, the circuit characteristics of the group of inverter circuits may be adjusted. For example, the output characteristics of the group of inverter circuits may be adjusted by changing the operation power supplied to the group of inverter circuits 301 included in the first differential amplifier circuit 30, the group of inverter circuits 311 included in the second differential amplifier circuit 31, and the group of inverter circuits 321 included in the third differential amplifier circuit 32 or the number of their stages.

Figure 15:
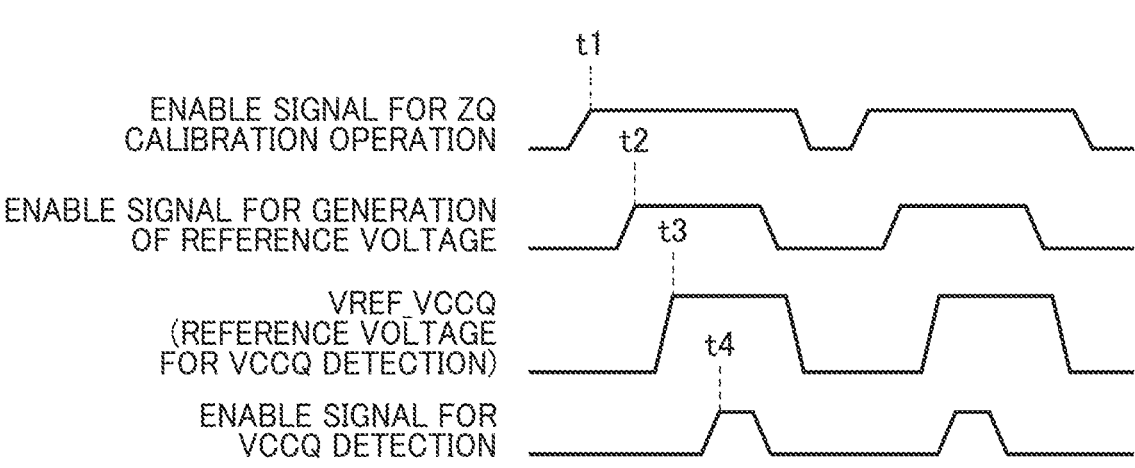
FIG. 15 is a timing chart of the case in which the ZQ calibration operation and VCCQ detection are performed in parallel.

FIG. 14 is a flowchart of a case in which the ZQ calibration operation and the VCCQ detection are performed in parallel. FIG. 15 is a timing chart of the case in which the ZQ calibration operation and the VCCQ detection are performed in parallel. Referring to FIG. 14, FIG. 15, and FIG. 16, the case in which the ZQ calibration operation and the VCCQ detection are performed in parallel will be described. Note that in the semiconductor memory device 20, the normal ZQ calibration operation and the VCCQ detection may be performed in parallel, or the short ZQ calibration operation and the VCCQ detection may be performed in parallel.

When the ZQ calibration operation is started, the voltage generating circuit 43 starts generating the reference voltage VREF_VCCQ for the VCCQ detection (step S011 of FIG.

14, from t1 to t2 of FIG. 15). In step S012 subsequent to step S011, the voltage generating circuit 43 completes the generation of the reference voltage VREF_VCCQ for the VCCQ detection (from t2 to t3 of FIG. 15).

In step S013 subsequent to step S012, it is determined whether the voltage VCCQ externally supplied is equal to or lower than the reference voltage VREF_VCCQ. When the VCCQ is equal to or lower than the VREF_VCCQ (step S013: YES), the process proceeds to the processing of step S014. In step S014, the circuit characteristics are adjusted. In step S015 subsequent to step S014, the generation of the reference voltage VREF_VCCQ ends.

Figure 17:
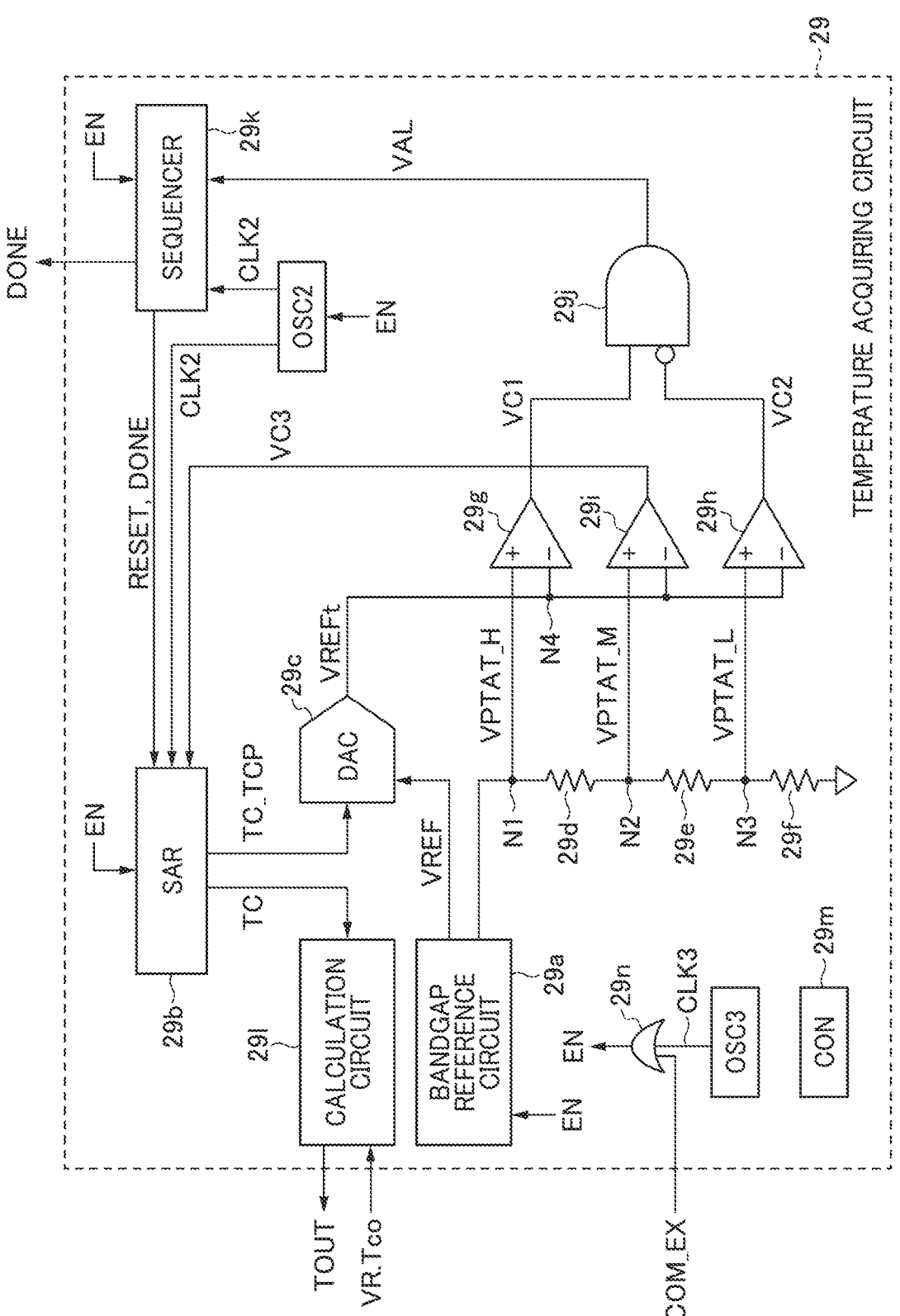
FIG. 17 is a circuit diagram showing the configuration of a temperature acquiring circuit.

Next, adjustment of the portions indicated by the arrows C (termination circuits 56) in FIG. 10 will be described. FIG. 17 is a block diagram showing an example of the configuration of the temperature acquiring circuit 29. The temperature acquiring circuit 29 includes a bandgap reference circuit 29a, a successive approximation register (SAR) 29b, a digital-analogue conversion circuit (DAC) 29c, resistor elements 29d, 29e, and 29f, voltage comparing circuits 29g, 29h, and 29l, an AND calculation circuit 29j, a sequencer 29k, a calculation circuit 29l, oscillators OSC2 and OSC3, and a control circuit 29m.

The bandgap reference circuit (hereinafter, also referred to as a BGR circuit) 29a is, for example, a circuit including a diode or the like. Upon receipt of an enable signal EN at an H (High) level, the BGR circuit 29a generates the reference voltage VREF and a voltage VPTAT_H that is proportional to the absolute temperature of the semiconductor memory device 20. The reference voltage VREF is a voltage that is not proportional to the temperature.

The oscillator OSC2 generates a second clock signal CLK2 in order to generate a voltage code based on the temperature. The oscillator OSC2 is started upon receipt of an enable signal EN from the oscillator OSC3 and starts generating the second clock signal CLK2. The oscillator OSC3 is used to generate the enable signal EN as a first command to drive the entire temperature acquiring circuit 29. The enable signal EN from the oscillator OSC3 is a clock signal of a longer cycle than the clock signal CLK2 from the OSC2. For example, the clock signal CLK2 is a clock signal of several tens of ns cycles, while the enable signal EN from the oscillator OSC3 is a clock signal of several ms cycles. That is, the cycle of the enable signal EN from the oscillator OSC3 is around a hundred to a thousand times the cycle of the clock signal CLK2.

The successive approximation register 29b starts operation upon receipt of an enable signal EN at an H (High) level from the oscillator OSC3. Further, the successive approximation register 29b operates in accordance with the timing (for example, rising edge) of the clock signal CLK2 received from the oscillator OSC2. The successive approximation register 29b supplies a stored temperature code TC (temperature signal) of a digital value to the digital-analogue conversion circuit 29c upon receipt of the enable signal EN from the oscillator OSC3. The successive approximation register 29b performs an update operation (also referred to as a sampling operation) of a temperature code to fix the latest temperature code upon receipt of a reset signal RESET from the sequencer 29k. The successive approximation register 29b supplies the stored temperature code TC to the calculation circuit 29l upon receipt of a completion notifying signal DONE from the sequencer 29k or completion of the sampling operation. The successive approximation register 29b basically stores the latest temperature code TC.

The temperature acquiring circuit 29 can generate the temperature code based on the enable signal EN periodically (for example, every several ms) generated by the OSC3 even when the memory cell arrays 110 and 210 are in a ready state. At this time, the temperature acquiring circuit 29 performs the successive approximation operation in accordance with the clock signal CLK2 from the oscillator OSC2 and sampling of the temperature of the semiconductor memory device 20, and generates the temperature code.

A voltage generating signal TOUT output from the temperature acquiring circuit 29 is digital data representing the temperature of the memory cell arrays 110 or 210, or the surroundings. Therefore, the voltage generating circuit 43 can change various voltages applied to the memory cell arrays 110 and 210 in accordance with the temperature of the memory cell arrays 110, 210. For example, a threshold voltage of memory cells fluctuates depending on the temperature. Therefore, in the operation of reading data, the voltage generating circuit 43 generates the voltage to be applied to word lines in accordance with the temperature characteristics of the threshold voltage of the memory cells. In this manner, even when the temperature of the memory cell arrays 110 and 210 changes, the sense amplifiers 112 and 212 can accurately read the data stored in the memory cells.

The digital-analogue conversion circuit 29c converts the temperature code TC into voltage. Specifically, the digital-analogue conversion circuit 29c generates a second reference voltage VREFt based on the reference voltage VREF and the temperature code TC. The second reference voltage VREFt is a voltage that is proportional to the temperature code TC.

In the voltage comparing circuit 29g, a non-inverting terminal is supplied with the voltage VPTAT_H via a node N1 and an inverting terminal is supplied with the voltage VREFt via a node N4. The voltage comparing circuit 29g outputs a signal VC1 at an H (High) level when the voltage VPTAT_H is higher than the voltage VREFt. The voltage comparing circuit 29g outputs the signal VC1 at an L (Low) level (L<H) when the voltage VPTAT_H is lower than the voltage VREFt.

In the resistor element 29d, the node N1 is connected to one end and the node N2 is connected to the other end. The resistance value or the like of the resistor element 29d will be described later.

In the voltage comparing circuit 29i, a non-inverting terminal is supplied with a voltage VPTAT_M (VPTAT_M<VPTAT_H) via the node N2 and an inverting terminal is supplied with the voltage VREFt via the node N4. The voltage comparing circuit 29i outputs a signal VC3 at an H (High) level when the voltage VPTAT_M is higher than the voltage VREFt. The voltage comparing circuit 29i outputs the signal VC3 at an L (Low) level when the voltage VPTAT_M is lower than the voltage VREFt.

In the resistor element 29e, the node N2 is connected to one end and a node N3 is connected to the other end. The resistance value or the like of the resistor element 29e will be described later.

In the voltage comparing circuit 29h, a non-inverting terminal is supplied with a voltage VPTAT_L (VPTAT_L<VPTAT_M) via the node N3, and an inverting terminal is supplied with the voltage VREFt via the node N4. The voltage comparing circuit 29h outputs a signal VC2 at an H (High) level when the voltage VPTAT_L is higher than the voltage VREFt. The voltage comparing circuit 29h outputs the signal VC2 at an L (Low) level when the voltage VPTAT_L is lower than the voltage VREFt.

In the resistor element 29f, the node N3 is connected to one end and the ground potential VSS is connected to the other end.

In the AND calculation circuit 29j, the signal VC1 is input to a non-inverting terminal and the signal VC2 is input to an inverting terminal. The AND calculation circuit 29j outputs a signal VAL at an H (High) level only when the signal VC1 is at an H (High) level and the signal VC2 is at an L (Low) level, and outputs the signal VAL at an L (Low) level in the other cases.

The sequencer 29k operates upon receipt of an enable signal EN at an H (High) level from the oscillator OSC3. Further, the sequencer 29k operates in accordance with the timing (for example, rising edge) of the clock signal CLK2 received from the oscillator OSC2. The sequencer 29k outputs the completion notifying signal DONE upon receipt of the signal VAL at an H (High) level. The sequencer 29k supplies the reset signal RESET to the successive approximation register 29b upon receipt of the signal VAL at an L (Low) level.

The calculation circuit 29l generates the voltage generating signal TOUT based on the temperature code TC supplied from the successive approximation register 29b, a voltage code VR, and a temperature coefficient Tco. The calculation circuit 29l derives the voltage generating signal TOUT using a formula "voltage generating signal TOUT=voltage code VR+temperature coefficient Tco*temperature code TC."

Figure 18:
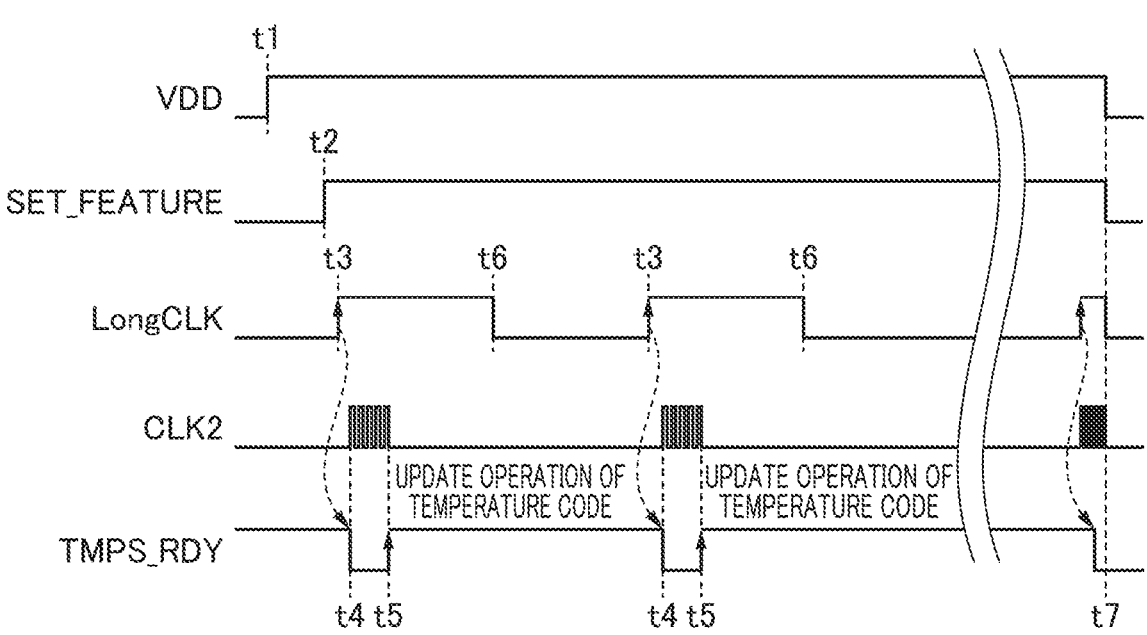
FIG. 18 is a timing chart for explaining an operation of the temperature acquiring circuit.
Figure 19:
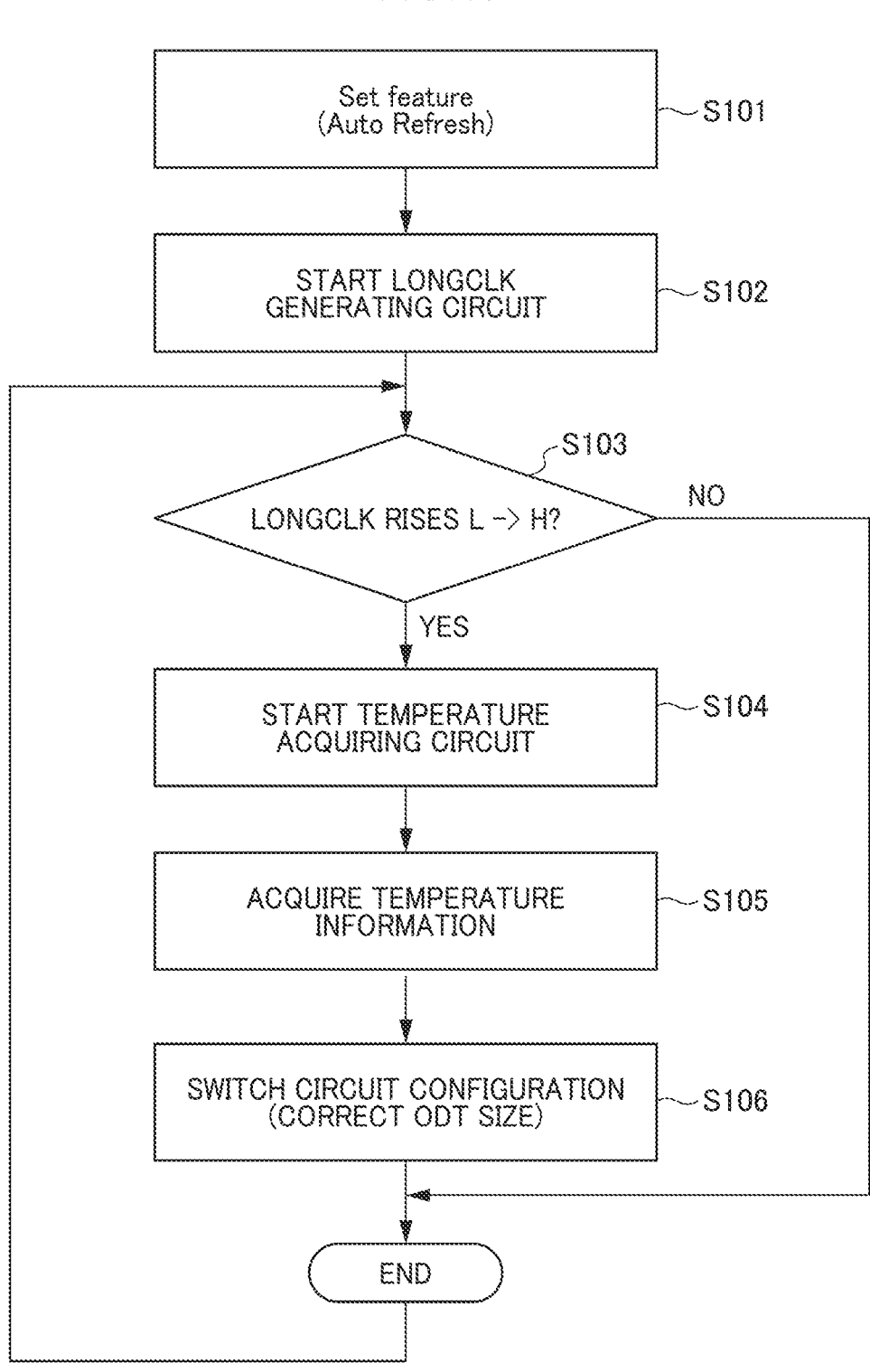
FIG. 19 is a flowchart for explaining the operation of the temperature acquiring circuit.

FIG. 18 is a timing chart showing an example of an operation of the temperature acquiring circuit 29. FIG. 19 is a flowchart showing the example of the operation of the temperature acquiring circuit 29.

First, at t1, the power supply voltage VCC, the power supply voltage VCCQ, and the like are input.

Next, at t2, a SET FEATURE signal rises (step S101 of FIG. 19). This allows the entire semiconductor memory device 20 to be able to receive commands. However, the semiconductor memory device 20 is in a stand-by state (ready state) in which no command has been received yet. The semiconductor memory device 20 turns into a busy state upon receipt of a command from the controller 10, but FIG. 19 shows only the period of the ready state, but not a busy state.

Next, a LongCLK generating circuit is started (step S102 of FIG. 19) at t3 to start outputting a LongCLK (step S103 of FIG. 19: YES). The LongCLK rises, for example, at several ms cycles.

When the LongCLK rises (step S103 of FIG. 19: YES) at t3, the temperature acquiring circuit 29 is started (step S104 of FIG. 19) at t4, and the oscillator OSC2 also starts outputting the clock signal CLK2. The clock signal CLK2 causes the sequencer 29k and the successive approximation register 29b to operate and acquires the temperature code corresponding to the temperature at that time of the memory cell arrays 110 and 210.

When the enable signal EN rises, a TMPS_RDY signal falls at t4. The TMPS_RDY signal is a signal indicating that the temperature acquiring circuit 29 is in a busy state. When the TMPS_RDY signal is low, the temperature acquiring circuit 29 is indicated in a busy state, and the temperature of the memory cell arrays 110 and 210 is detected, and it's indicated that the temperature code is generated. When the TMPS_RDY signal is high, the temperature acquiring circuit 29 is indicated in a ready state, and the enable signal EN and the like can be received (stand-by state).

At t4 to t5, the temperature acquiring circuit 29 is in a busy state, and the sequencer 29k and the successive approximation register 29b generate the temperature code (step S105 of FIG. 19).

When the temperature code is generated at t5, the TMPS_RDY signal rises and the temperature code retained in the successive approximation register 29b is updated. The operation of updating the temperature code as such is also referred to as "refresh" of the temperature code. The operation of automatically updating the temperature code each time the enable signal EN rises is also referred to as "auto refresh" of the temperature code.

In accordance with the refresh operation of the temperature code at t5, the circuit characteristics of the termination circuit 56 shown in FIG. 10 and FIG. 11 are adjusted. For example, in the pull-up circuit 561 of the termination circuit 56, the driving state (for example, the number of p-type transistors to be driven) of the plurality of p-type transistors 56a0 to 56a4 is changed so that the pull-up characteristics are adjusted. Further, in the pull-down circuit 562, the driving state (for example, the number of n-type transistors to be driven) of the plurality of n-type transistors 56d0 to 56d4 is changed so that the pull-down characteristics are adjusted. The circuit characteristics (ODT size) of the termination circuit 56 can be set using the temperature code updated through the refresh of the temperature code (step S106 of FIG. 19).

Next, at t6, the enable signal EN falls and the temperature acquiring circuit 29 is in a ready state. During the period in which the power supply voltage VCC and the power supply voltage VCCQ are input and the SET FEATURE signal is rising, the auto refresh (t3 to t6) of the temperature code is repeatedly executed.

Thereafter, at t7, when the power supply is cut, the auto refresh of the temperature code is stopped. In this case, even in the middle of the auto refresh of the temperature code, the auto refresh is suspended.

The present embodiments have been described above with reference to the specific examples. However, the present disclosure is not limited to these specific examples. These specific examples with design changes appropriately added by those skilled in the art are also included in the scope of the present disclosure as long as they have the characteristics of the present disclosure. The elements included in the aforementioned specific examples and their arrangements, conditions, and shapes are not limited to those illustrated, and may appropriately be changed. The combination of the elements of the aforementioned specific examples may appropriately be changed unless any technical contradiction occurs.

What is claimed is:

1. A semiconductor memory device, comprising:
a terminal for input/output;
a memory cell array;
an input/output circuit that inputs/outputs a signal between the terminal for input/output and the memory cell array;
a termination circuit that is connected to the terminal for input/output and in which a circuit characteristic is adjustable;
a temperature sensor that can output temperature information on the memory cell array;
a register that retains a temperature code corresponding to the temperature information output from the temperature sensor; and
a temperature information updating circuit that updates the temperature code stored in the register, wherein when the temperature code stored in the register is updated, the circuit characteristic of the termination circuit is adjusted.

2. A semiconductor memory device, comprising:

a terminal for input/output;

a terminal for first power input to which a first voltage is supplied;

a terminal for second voltage supply to which a second voltage lower than the first voltage is supplied;

a terminal for third voltage supply to which a third voltage lower than the second voltage is supplied;

a memory cell array;

an input/output circuit that inputs/outputs a signal between the terminal for input/output and the memory cell array and that includes an input circuit in which a circuit characteristic is adjustable; a reference voltage generation circuit that generates a power supply reference voltage; and a voltage acquiring circuit that acquires voltage information based on a comparison between the second power supply voltage input to the terminal for second power input and the power supply reference voltage generated by the reference voltage circuit, wherein when a change in the voltage information is detected by the voltage acquiring circuit, the circuit characteristic of the input circuit of the input/output circuit is adjusted.

3. The semiconductor device according to claim 2, wherein the input/output circuit includes:

a first differential circuit that outputs a first internal signal by comparing a data signal received at the terminal for input/output and a signal reference voltage, the first differential circuit includes a first p-type transistor having one end connected to the terminal for second voltage supply, a second p-type transistor having one end connected to the terminal for second voltage supply and a gate connected to a gate of the first p-type transistor, a first n-type transistor having one end connected to the other end of the first p-type transistor and a gate supplied with the signal reference voltage, a second n-type transistor having one end connected to the other end of the second p-type transistor and a gate connected to the terminal for input/output, and a third n-type transistor having one end connected to the other end of the first n-type transistor and the other end of the second n-type transistor, the other end connected to the terminal for third voltage supply and a gate supplied with a control signal, and when the change in the voltage information is detected by the voltage acquiring circuit, the circuit characteristic of the input circuit of the input/output circuit is adjusted by changing the control signal.

4. The semiconductor device according to claim 1, wherein the input/output circuit includes:

a first differential circuit that outputs a first internal signal by comparing a data signal received at the terminal for input/output and a reference voltage.

5. The semiconductor device according to claim 4, further comprising:

a terminal for data strobe, wherein the input/output circuit further includes:

a second differential circuit that outputs a second internal signal by comparing a strobe signal received at the terminal for data strobe and the reference voltage.

6. The semiconductor device according to claim 5, wherein the input/output circuit further includes:

a first data latch circuit that latches first data corresponding to the first internal signal in response to the second internal signal, and sends the first data toward the memory cell array.

7. The semiconductor device according to claim 6, further comprising:

a terminal for complementary data strobe, wherein the input/output circuit further includes:

a third differential circuit that outputs a third internal signal by comparing a complementary strobe signal received at the terminal for complementary data strobe and the reference voltage; and a second data latch circuit that latches first data corresponding to the first internal signal in response to the third internal signal, and sends the second data toward the memory cell array.

8. The semiconductor device according to claim 1, further comprising:

a terminal for first voltage supply to which a first voltage is supplied;

a terminal for second voltage supply to which a second voltage lower than the first voltage is supplied; and a terminal for third voltage supply to which a third voltage lower than the second voltage is supplied.

9. The semiconductor device according to claim 8, wherein the termination circuit includes:

a plurality of p-type transistors connected in parallel between the terminal for second voltage supply and the terminal for input/output; and a plurality of n-type transistors connected in parallel between the terminal for input/output and the terminal for third voltage supply.

10. The semiconductor device according to claim 9, wherein when the temperature code stored in the register is updated, the circuit characteristic of the termination circuit is adjusted by changing a driving state of the plurality of p-type transistors and a driving state of the plurality of n-type transistors.

* * * * *